US010534043B2

(12) United States Patent
Woods et al.

(10) Patent No.: US 10,534,043 B2
(45) Date of Patent: Jan. 14, 2020

(54) CALIBRATION OF MAGNETIC AND OPTICAL SENSORS IN A VIRTUAL REALITY OR AUGMENTED REALITY DISPLAY SYSTEM

(71) Applicant: Magic Leap, Inc., Plantation, FL (US)

(72) Inventors: Michael Woods, Mountain View, CA (US); Scott David Nortman, Sunrise, FL (US)

(73) Assignee: Magic Leap, Inc., Plantation, FL (US)

(*) Notice: Subject to any disclaimer, the term of this patent is extended or adjusted under 35 U.S.C. 154(b) by 270 days.

(21) Appl. No.: 15/714,905

(22) Filed: Sep. 25, 2017

(65) Prior Publication Data

US 2018/0088185 A1 Mar. 29, 2018

Related U.S. Application Data

(60) Provisional application No. 62/400,079, filed on Sep. 26, 2016.

(51) Int. Cl.
| | | |
|---|---|---|
| *G01R 33/00* | (2006.01) | |
| *G06F 3/01* | (2006.01) | |
| *G01R 35/00* | (2006.01) | |
| *G06F 1/16* | (2006.01) | |
| *G06F 3/03* | (2006.01) | |
| *G06F 3/038* | (2013.01) | |

(Continued)

(52) U.S. Cl.
CPC ......... *G01R 33/0035* (2013.01); *G01R 35/00* (2013.01); *G06F 1/163* (2013.01); *G06F 3/011* (2013.01); *G06F 3/012* (2013.01); *G06F 3/0304* (2013.01); *G06F 3/038* (2013.01); *G06F 3/0346* (2013.01); *G06T 19/006* (2013.01)

(58) Field of Classification Search
CPC .................. G01R 33/0017; G01R 33/0035
See application file for complete search history.

(56) References Cited

U.S. PATENT DOCUMENTS

| 8,950,867 B2 | 2/2015 | Macnamara |
| 9,215,293 B2 | 12/2015 | Miller |

(Continued)

OTHER PUBLICATIONS

International Search Report and Written Opinion for PCT Application No. PCT/US2017/53306, dated Jan. 23, 2018.

*Primary Examiner* — Tung X Nguyen
(74) *Attorney, Agent, or Firm* — Knobbe, Martens, Olson & Bear, LLP

(57) ABSTRACT

A system for calibrating alignment of magnetic and optical sensors in a virtual reality (VR) or augmented reality (AR) device. The system can include a controller, a waveform generator, and an electrical driver. The waveform generator can produce calibration waveforms under control of the controller. The system can also include conductive loops which are energized with electrical currents corresponding to the calibration waveforms. The controller can cause the waveform generator to generate a first calibration waveform to calibrate a first type of magnetic sensor in the display device, and to generate a second calibration waveform to calibrate a second type of magnetic sensor in the display device. The system may also include one or more optical fiducial markers in a known spatial relationship with respect to the conductive loops. The optical fiducial markers can be used to calibrate the alignment direction of one or more optical sensors.

28 Claims, 20 Drawing Sheets

(51) Int. Cl.
*G06F 3/0346* (2013.01)
*G06T 19/00* (2011.01)

(56) References Cited

U.S. PATENT DOCUMENTS

| | | | |
|---|---|---|---|
| 9,310,559 | B2 | 4/2016 | Macnamara |
| 9,348,143 | B2 | 5/2016 | Gao et al. |
| D758,367 | S | 6/2016 | Natsume |
| 9,417,452 | B2 | 8/2016 | Schowengerdt et al. |
| 9,671,566 | B2 | 6/2017 | Abovitz et al. |
| 9,791,700 | B2 | 10/2017 | Schowengerdt et al. |
| 2002/0093331 | A1 | 7/2002 | Rochelle et al. |
| 2007/0299623 | A1 | 12/2007 | Gandelsman et al. |
| 2011/0248704 | A1 | 10/2011 | Chowdhary et al. |
| 2012/0127062 | A1 | 5/2012 | Bar-Zeev et al. |
| 2013/0082922 | A1 | 4/2013 | Miller |
| 2013/0125027 | A1 | 5/2013 | Abovitz |
| 2014/0071539 | A1 | 3/2014 | Gao |
| 2014/0177023 | A1 | 6/2014 | Gao et al. |
| 2014/0218468 | A1 | 8/2014 | Gao et al. |
| 2014/0306866 | A1 | 10/2014 | Miller et al. |
| 2015/0103306 | A1 | 4/2015 | Kaji et al. |
| 2015/0178939 | A1 | 6/2015 | Bradski et al. |
| 2015/0222883 | A1 | 8/2015 | Welch |
| 2015/0222884 | A1 | 8/2015 | Cheng |
| 2015/0268369 | A1 | 9/2015 | Dodds |
| 2015/0268415 | A1 | 9/2015 | Schowengerdt et al. |
| 2015/0285612 | A1 | 10/2015 | Miles et al. |
| 2015/0302652 | A1 | 10/2015 | Miller et al. |
| 2015/0346490 | A1 | 12/2015 | TeKolste et al. |
| 2015/0346495 | A1 | 12/2015 | Welch et al. |
| 2016/0005174 | A1* | 1/2016 | Ellsworth ............... G06T 7/73 382/103 |
| 2016/0011419 | A1 | 1/2016 | Gao |
| 2016/0026253 | A1* | 1/2016 | Bradski ............... G02B 27/225 345/8 |
| 2019/0056693 | A1* | 2/2019 | Gelman ............... G02B 27/017 |

* cited by examiner

CALIBRATION OF MAGNETIC AND OPTICAL SENSORS IN A VIRTUAL REALITY OR AUGMENTED REALITY DISPLAY SYSTEM

CROSS-REFERENCE TO RELATED APPLICATIONS

This application claims the benefit of priority to U.S. Patent Application No. 62/400,079, filed Sep. 26, 2016, and entitled "SYSTEMS AND METHODS FOR AUGMENTED REALITY," which is hereby incorporated by reference herein in its entirety.

BACKGROUND

Field

Modern computing and display technologies have facilitated the development of virtual reality ("VR"), augmented reality ("AR"), and mixed reality ("MR") systems. A VR system creates a simulated environment for a user to experience. This can be done by presenting computer-generated imagery to the user through a head-mounted display. This imagery creates a sensory experience which immerses the user in the simulated environment. A VR scenario typically involves presentation of only computer-generated imagery rather than also including actual real-world imagery.

An AR system generally supplements a real-world environment with simulated elements. For example, an AR system may provide a user with a view of the surrounding real-world environment via a head-mounted display. However, computer-generated imagery can also be presented on the display to enhance the real-world environment. This computer-generated imagery can include elements which are contextually-related to the real-world environment. Such elements can include simulated text, images, objects, etc. An MR system is a type of AR system which also introduces simulated objects into a real-world environment, but these objects typically feature a greater degree of interactivity. The simulated elements can often times be interactive in real time.

SUMMARY

In some embodiments, a system is disclosed for calibrating alignment of two or more magnetic sensors in a virtual reality (VR) or augmented reality (AR) display device, the system comprising: a controller; a waveform generator configured to generate a first calibration waveform and a second calibration waveform under control of the controller; a first conductive loop oriented in a first plane orthogonal to a first axis passing through the first conductive loop; a second conductive loop oriented in a second plane parallel to the first plane and spaced apart from the first conductive loop along the first axis; and an electrical driver connected to the waveform generator to receive the first and second calibration waveforms, to generate corresponding first and second electrical output currents, and to provide the first and second electrical output currents to the first conductive loop and the second conductive loop, wherein the controller is configured to cause the waveform generator to generate the first calibration waveform to calibrate a first type of magnetic sensor in the display device, and to generate the second calibration waveform to calibrate a second type of magnetic sensor in the display device.

In some embodiments, a method is disclosed for calibrating alignment of two or more magnetic sensors in a virtual reality (VR) or augmented reality (AR) display device, the method comprising: generating a first calibration waveform; energizing, with the first calibration waveform, a first conductive loop oriented in a first plane orthogonal to a first axis passing through the first conductive loop and a second conductive loop oriented in a second plane parallel to the first plane and spaced apart from the first conductive loop along the first axis; determining a first measurement, using a first type of magnetic sensor of the display device, indicative of an orientation of a magnetic field produced by the first and second conductive loops when energized with the first calibration waveform; generating a second calibration waveform; energizing the first and second conductive loops with the second calibration waveform; determining a second measurement, using a second type of magnetic sensor of the display device, indicative of an orientation of a magnetic field produced by the first and second conductive loops when energized with the second calibration waveform; and comparing the first measurement with the second measurement.

In some embodiments, a system is disclosed for calibrating alignment of one or more magnetic sensors and one or more optical sensors in a virtual reality (VR) or augmented reality (AR) display device, the system comprising: a first conductive loop oriented in a first plane orthogonal to a first axis passing through the first conductive loop; a second conductive loop oriented in a second plane parallel to the first plane and spaced apart from the first conductive loop along the first axis; and one or more optical fiducial markers supported in a predetermined spatial relationship with respect to the first conductive loop and the second conductive loop.

In some embodiments, a method is disclosed for calibrating alignment of one or more magnetic sensors and one or more optical sensors in a virtual reality (VR) or augmented reality (AR) display device, the method comprising: generating a calibration waveform; energizing, with the calibration waveform, a first conductive loop oriented in a first plane orthogonal to a first axis passing through the first conductive loop and a second conductive loop oriented in a second plane parallel to the first plane and spaced apart from the first conductive loop along the first axis; determining a first measurement, using a magnetic sensor of the display device, indicative of an orientation of a magnetic field produced by the first and second conductive loops when energized with the calibration waveform; determining, with an optical sensor of the display device, a second measurement indicative of a spatial relationship of an optical fiducial marker with respect to the first conductive loop and the second conductive loop; and comparing the first measurement with the second measurement.

Details of one or more embodiments of the subject matter described in this specification are set forth in the accompanying drawings and in the description below. Other features, aspects, and advantages will become apparent from the description, the drawings, and the claims.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Overview of AR, VR and Localization Systems

Figure 1:
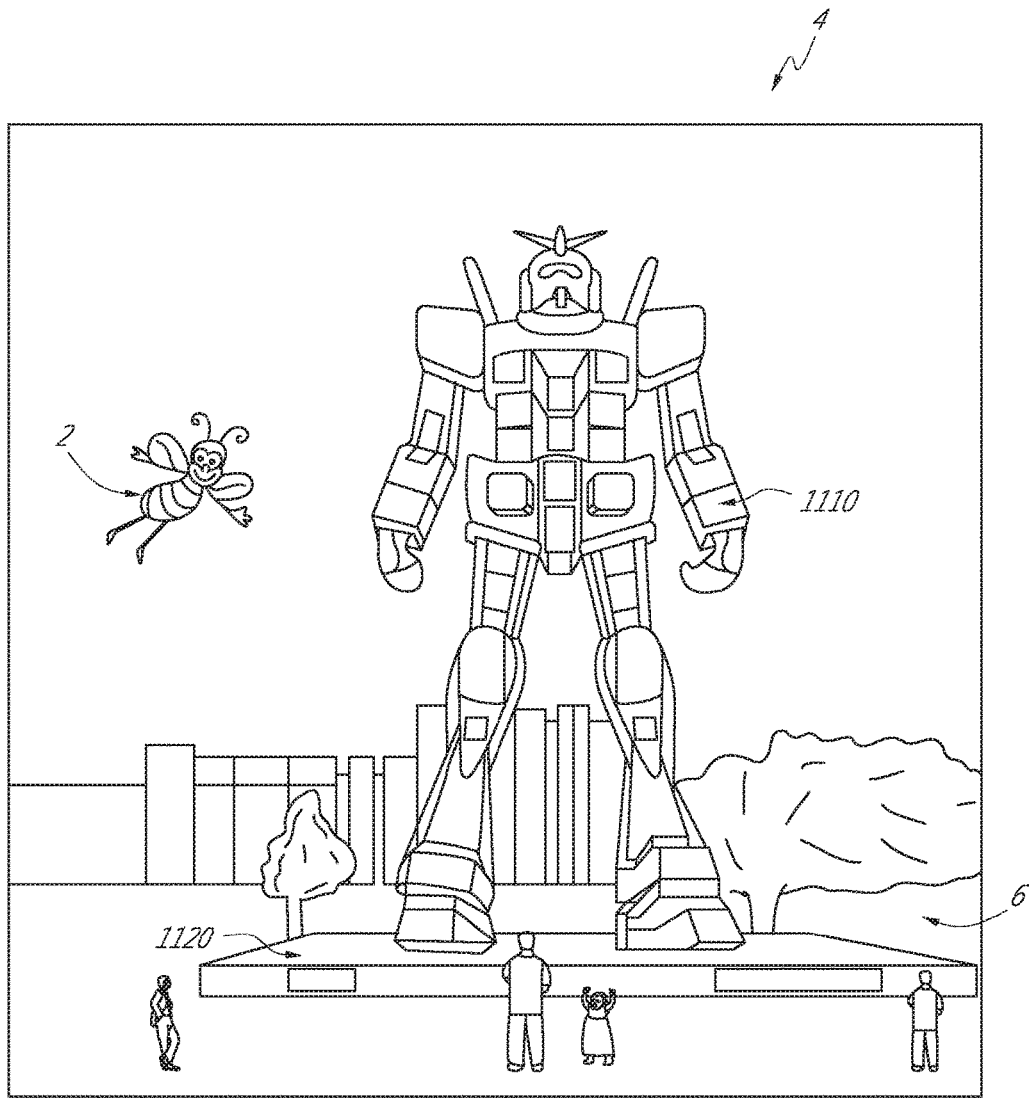
FIG. 1 depicts an illustration of an augmented reality scenario with certain virtual reality objects, and certain physical objects viewed by a person.

In FIG. 1, an augmented reality scene (4) is depicted where a user of an AR technology sees a real-world park-like setting (6) featuring people, trees, buildings in the background, and a concrete platform (1120). In addition to these items, the user of the AR technology also perceives that he "sees" a robot statue (1110) standing upon the real-world platform (1120), and a cartoon-like avatar character (2) flying by which seems to be a personification of a bumble bee, even though these elements (2, 1110) do not exist in the real world. The human visual perception system is very complex, and producing a VR or AR technology that facilitates a comfortable, natural-feeling, rich presentation of virtual image elements amongst other virtual or real-world imagery elements is challenging.

Head-worn VR or AR displays (or helmet-mounted displays, or smart glasses) typically are at least loosely coupled to a user's head, and thus move when the user's head moves. If the user's head motions are detected by the display system, the data being displayed can be updated to take the change in head pose into account. As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can permit the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's eyes. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a bat-like object communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are advantageous to an AR system, they may be difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches may not perform localization at satisfactory speed or precision standards. Thus, there is a need for a better localization system in the context of AR and VR devices.

Example AR and VR Systems and Components

With reference to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
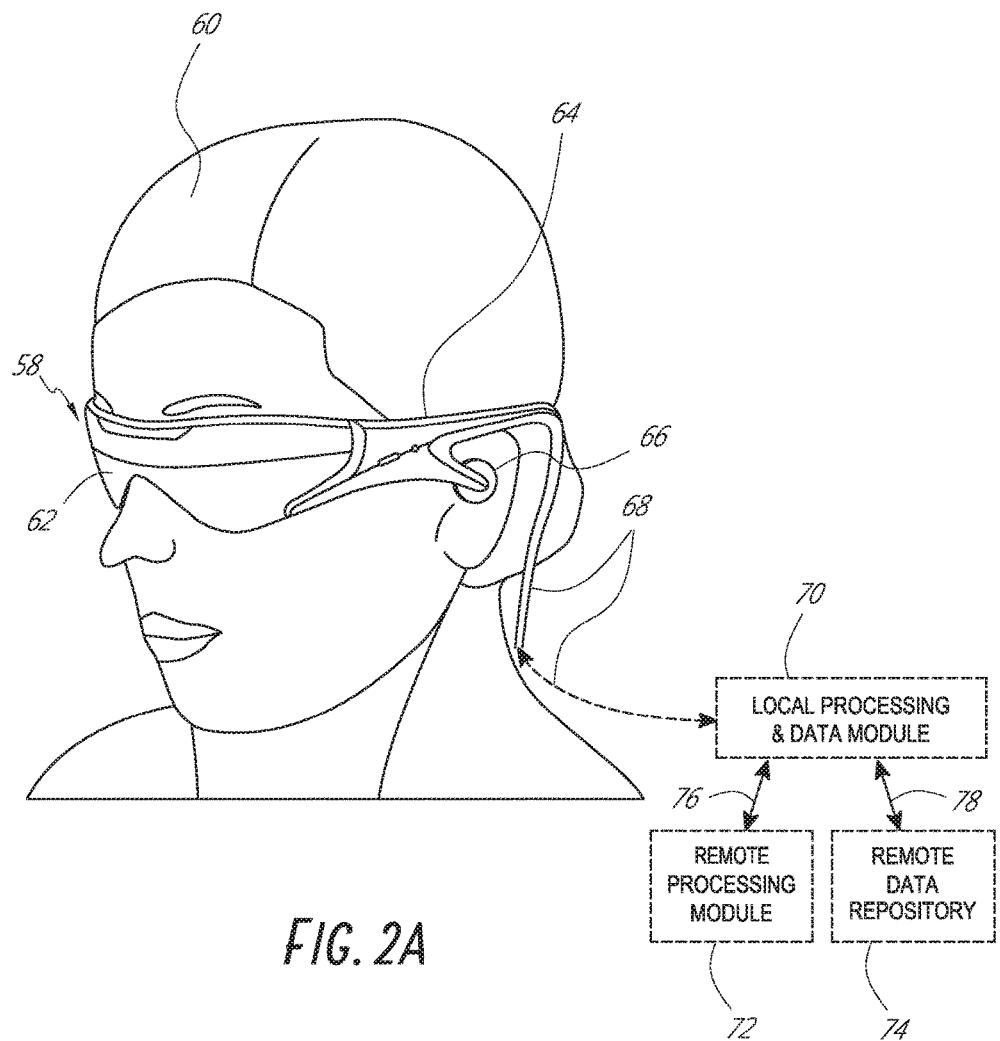
FIGS. 2A-2D schematically illustrate examples of a wearable system.
Figure 2B:
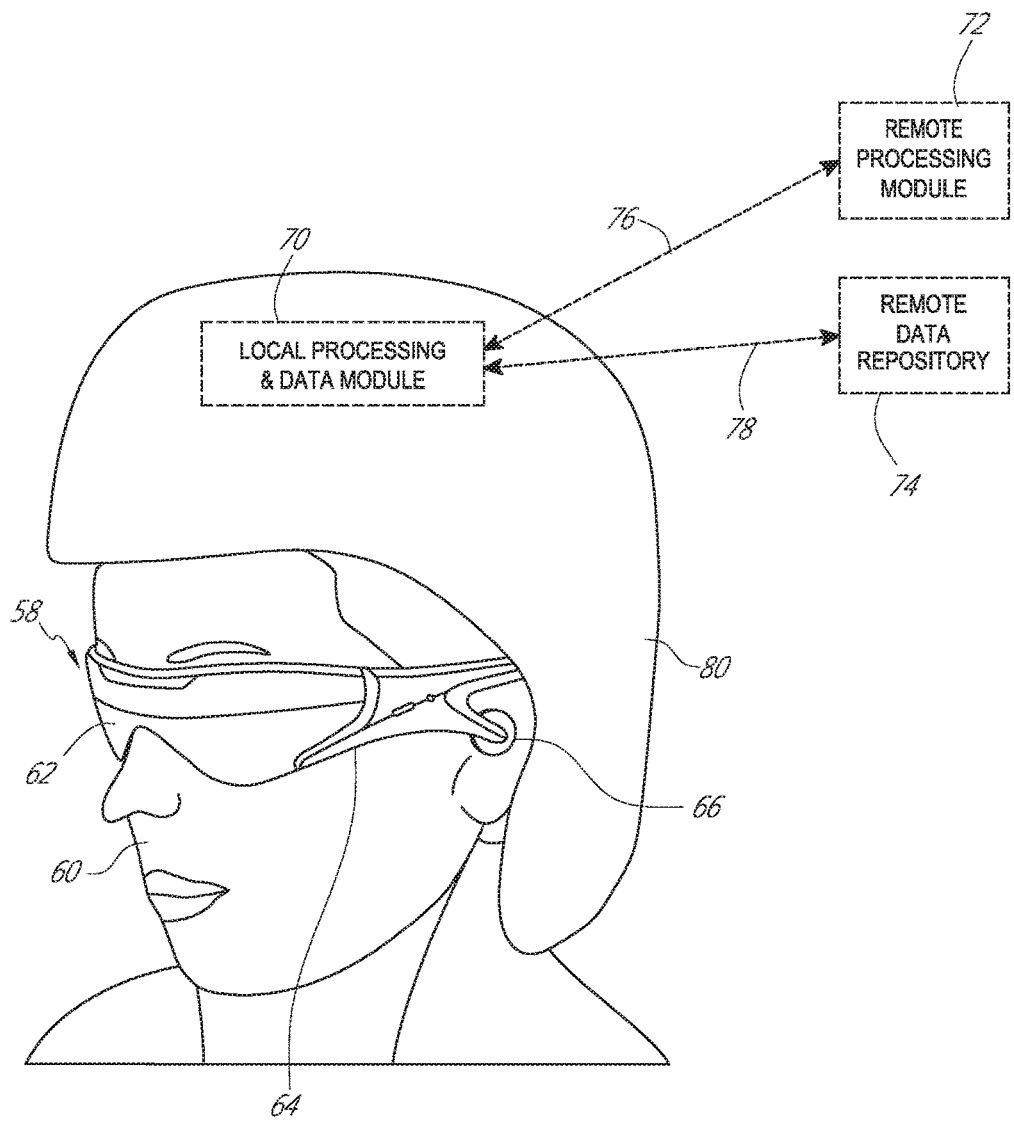
Figure 2C:
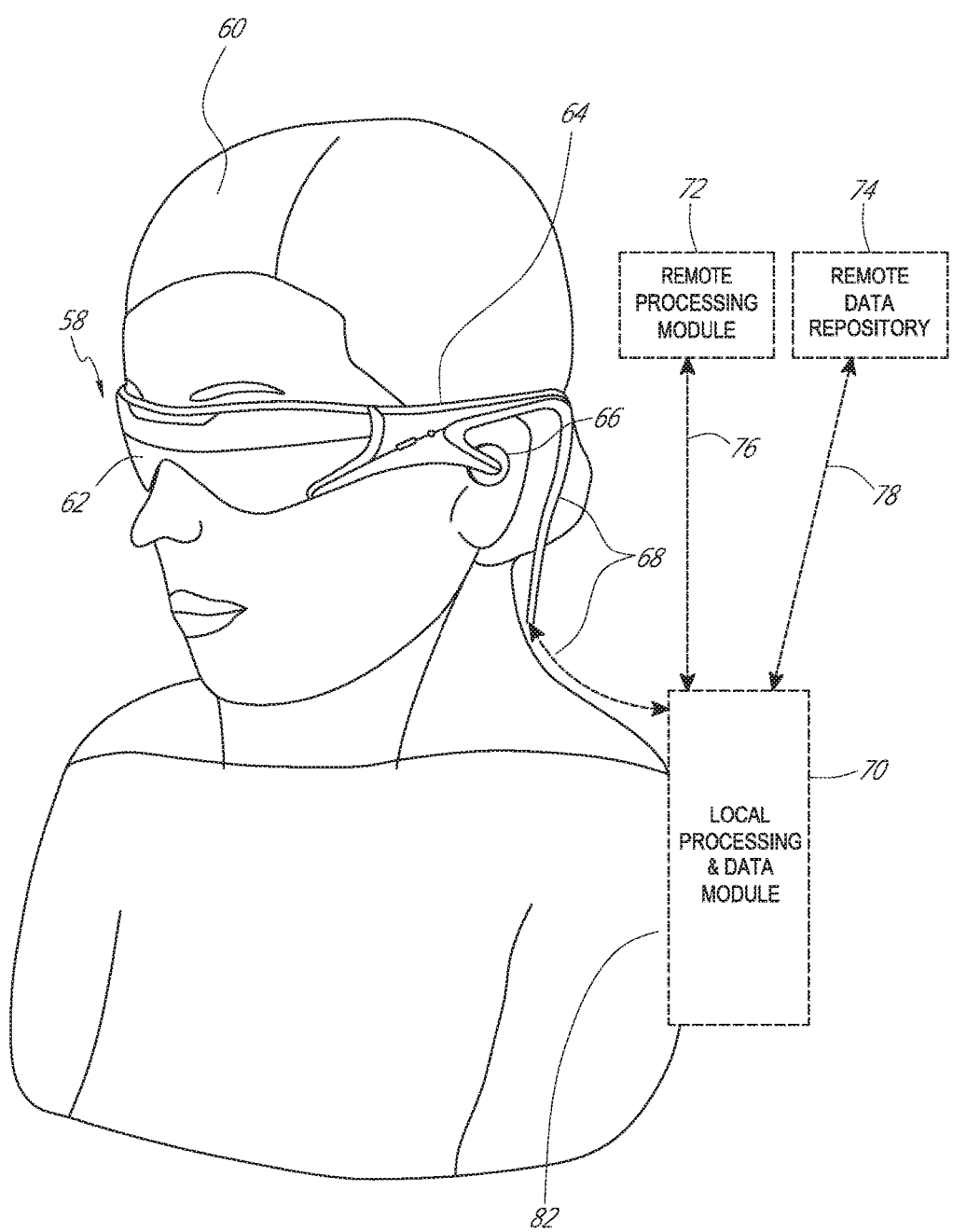
Figure 2D:
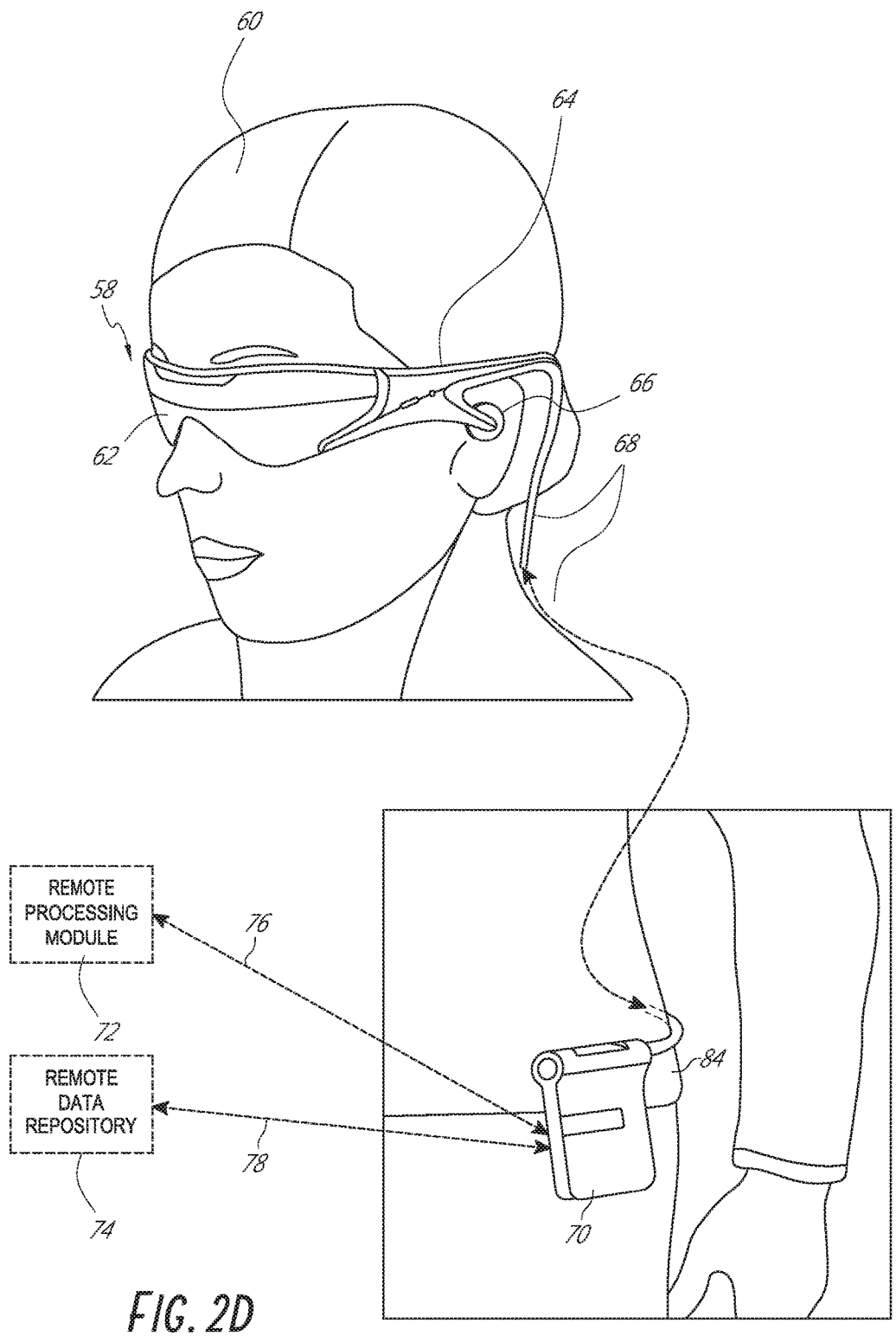

As shown in FIG. 2A, an AR system user (60) is depicted wearing head mounted component (58) featuring a frame (64) structure coupled to a display system (62) positioned in front of the eyes of the user. A speaker (66) is coupled to the frame (64) in the depicted configuration and positioned adjacent the ear canal of the user (in one embodiment, another speaker, not shown, is positioned adjacent the other ear canal of the user to provide for stereo/shapeable sound control). The display (62) is operatively coupled (68), such as by a wired lead or wireless connectivity, to a local processing and data module (70) which may be mounted in a variety of configurations, such as fixedly attached to the frame (64), fixedly attached to a helmet or hat (80) as shown in the embodiment of FIG. 2B, embedded in headphones, removably attached to the torso (82) of the user (60) in a backpack-style configuration as shown in the embodiment of FIG. 2C, or removably attached to the hip (84) of the user (60) in a belt-coupling style configuration as shown in the embodiment of FIG. 2D.

The local processing and data module (70) may comprise a power-efficient processor or controller, as well as digital memory, such as flash memory, both of which may be utilized to assist in the processing, caching, and storage of data a) captured from sensors which may be operatively coupled to the frame (64), such as image capture devices (such as cameras), microphones, inertial measurement units, accelerometers, compasses, GPS units, radio devices, and/or gyros; and/or b) acquired and/or processed using the remote processing module (72) and/or remote data repository (74), possibly for passage to the display (62) after such processing or retrieval. The local processing and data module (70) may be operatively coupled (76, 78), such as via a wired or wireless communication links, to the remote processing module (72) and remote data repository (74) such that these remote modules (72, 74) are operatively coupled to each other and available as resources to the local processing and data module (70).

In one embodiment, the remote processing module (72) may comprise one or more relatively powerful processors or controllers configured to analyze and process data and/or image information. In one embodiment, the remote data repository (74) may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Figure 3:
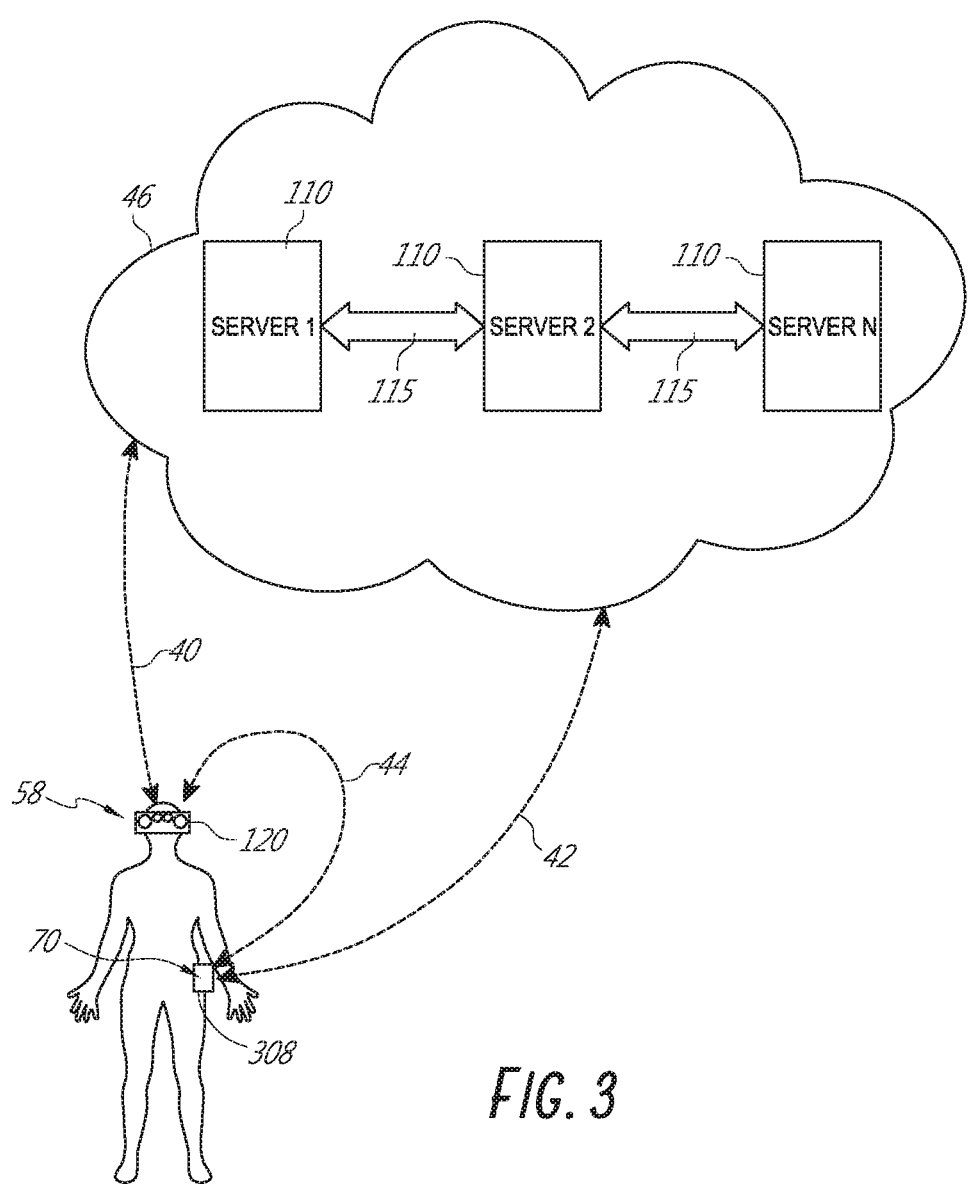
FIG. 3 schematically illustrates coordination between cloud computing assets and local processing assets.

With reference now to FIG. 3, a schematic illustrates coordination between the cloud computing assets (46) and local processing assets, which may, for example reside in head mounted componentry (58) coupled to the user's head (120) and a local processing and data module (70), coupled to the user's belt (308; therefore the component 70 may also be termed a "belt pack" 70), as shown in FIG. 3. In one embodiment, the cloud (46) assets, such as one or more server systems (110) are operatively coupled (115), such as via wired or wireless networking (wireless being preferred for mobility, wired being preferred for certain high-bandwidth or high-data-volume transfers that may be desired), directly to (40, 42) one or both of the local computing assets, such as processor and memory configurations, coupled to the user's head (120) and belt (308) as described above. These computing assets local to the user may be operatively coupled to each other as well, via wired and/or wireless connectivity configurations (44), such as the wired coupling (68) discussed below in reference to FIG. 8. In one embodiment, to maintain a low-inertia and small-size subsystem mounted to the user's head (120), primary transfer between the user and the cloud (46) may be via the link between the subsystem mounted at the belt (308) and the cloud, with the head mounted (120) subsystem primarily data-tethered to the belt-based (308) subsystem using wireless connectivity, such as ultra-wideband ("UWB") connectivity, as is currently employed, for example, in personal computing peripheral connectivity applications.

With efficient local and remote processing coordination, and an appropriate display device for a user, such as the user interface or user display system (62) shown in FIG. 2A, or variations thereof, aspects of one world pertinent to a user's current actual or virtual location may be transferred or "passed" to the user and updated in an efficient fashion. In other words, a map of the world may be continually updated at a storage location which may partially reside on the user's AR system and partially reside in the cloud resources. The map (also referred to as a "passable world model") may be a large database comprising raster imagery, 3-D and 2-D points, parametric information and other information about the real world. As more and more AR users continually capture information about their real environment (e.g., through cameras, sensors, IMUs, etc.), the map becomes more and more accurate and complete.

With a configuration as described above, wherein there is one world model that can reside on cloud computing resources and be distributed from there, such world can be "passable" to one or more users in a relatively low bandwidth form preferable to trying to pass around real-time video data or the like. The augmented experience of the person standing near the statue (e.g., as shown in FIG. 1) may be informed by the cloud-based world model, a subset of which may be passed down to them and their local display device to complete the view. A person sitting at a remote display device, which may be as simple as a personal computer sitting on a desk, can efficiently download that same section of information from the cloud and have it rendered on their display. Indeed, one person actually present in the park near the statue may take a remotely-located friend for a walk in that park, with the friend joining through virtual and augmented reality. The system will need to know where the street is, wherein the trees are, where the statue is—but with that information on the cloud, the joining friend can download from the cloud aspects of the scenario, and then start walking along as an augmented reality local relative to the person who is actually in the park.

Three-dimensional (3-D) points may be captured from the environment, and the pose (e.g., vector and/or origin position information relative to the world) of the cameras that capture those images or points may be determined, so that these points or images may be "tagged", or associated, with this pose information. Then points captured by a second camera may be utilized to determine the pose of the second camera. In other words, one can orient and/or localize a second camera based upon comparisons with tagged images from a first camera. Then this knowledge may be utilized to extract textures, make maps, and create a virtual copy of the real world (because then there are two cameras around that are registered).

So at the base level, in one embodiment a person-worn system can be utilized to capture both 3-D points and the 2-D images that produced the points, and these points and images may be sent out to a cloud storage and processing resource. They may also be cached locally with embedded pose information (e.g., cache the tagged images); so the cloud may have on the ready (e.g., in available cache) tagged 2-D images (e.g., tagged with a 3-D pose), along with 3-D points. If a user is observing something dynamic, he may also send additional information up to the cloud pertinent to the motion (for example, if looking at another person's face, the user can take a texture map of the face and push that up at an optimized frequency even though the surrounding world is otherwise basically static). More information on object recognizers and the passable world model may be found in U.S. Patent Pub. No. 2014/0306866, entitled "System and method for augmented and virtual reality", which is incorporated by reference in its entirety herein, along with the following additional disclosures, which related to augmented and virtual reality systems such as those developed by Magic Leap, Inc. of Plantation, Florida: U.S. Patent Pub. No. 2015/0178939; U.S. Patent Pub. No. 2015/0205126; U.S. Patent Pub. No. 2014/0267420; U.S. Patent Pub. No. 2015/0302652; U.S. Patent Pub. No. 2013/0117377; and U.S. Patent Pub. No. 2013/0128230, each of which is hereby incorporated by reference herein in its entirety.

GPS and other localization information may be utilized as inputs to such processing. Highly accurate localization of the user's head, totems, hand gestures, haptic devices etc. may be advantageous in order to display appropriate virtual content to the user.

The head-mounted device (58) may include displays positionable in front of the eyes of the wearer of the device. The displays may comprise light field displays. The displays may be configured to present images to the wearer at a plurality of depth planes. The displays may comprise planar waveguides with diffraction elements. Examples of displays, head-mounted devices, and other AR components usable with any of the embodiments disclosed herein are described in U.S. Patent Publication No. 2015/0016777. U.S. Patent Publication No. 2015/0016777 is hereby incorporated by reference herein in its entirety.

Examples of Electromagnetic Localization

One approach to achieve high precision localization may involve the use of an electromagnetic (EM) field coupled with electromagnetic sensors that are strategically placed on the user's AR head set, belt pack, and/or other ancillary devices (e.g., totems, haptic devices, gaming instruments, etc.). Electromagnetic tracking systems typically comprise at least an electromagnetic field emitter and at least one electromagnetic field sensor. The electromagnetic field emitter generates an electromagnetic field having a known spatial (and/or temporal) distribution in the environment of wearer of the AR headset. The electromagnetic filed sensors measure the generated electromagnetic fields at the locations of the sensors. Based on these measurements and knowledge of the distribution of the generated electromagnetic field, a pose (e.g., a position and/or orientation) of a field sensor relative to the emitter can be determined. Accordingly, the pose of an object to which the sensor is attached can be determined.

Figure 4:
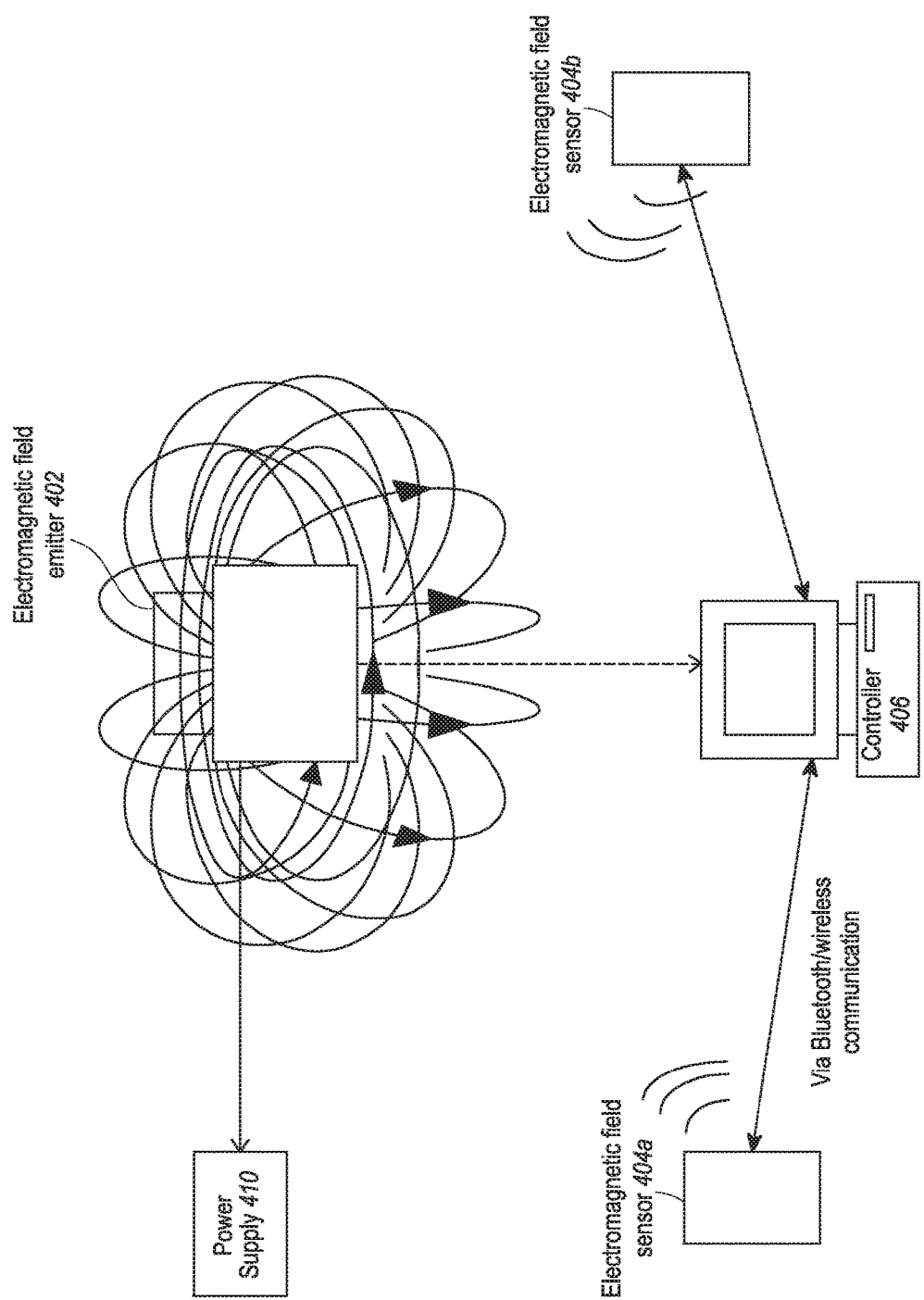
FIG. 4 schematically illustrates an example system diagram of an electromagnetic (EM) tracking system.

With reference now to FIG. 4, an example system diagram of an electromagnetic tracking system (e.g., such as those developed by organizations such as the Biosense division of Johnson & Johnson Corporation, Polhemus, Inc. of Colchester, Vermont, manufactured by Sixense Entertainment, Inc. of Los Gatos, Calif., and other tracking companies) is illustrated. In one or more embodiments, the electromagnetic tracking system comprises an electromagnetic field emitter 402 which is configured to emit a known magnetic field. As shown in FIG. 4, the electromagnetic field emitter may be coupled to a power supply (e.g., electric current, batteries, etc.) to provide power to the emitter 402.

In one or more embodiments, the electromagnetic field emitter 402 comprises several coils (e.g., at least three coils positioned perpendicular to each other to produce field in the X, Y and Z directions) that generate magnetic fields. This magnetic field is used to establish a coordinate space (e.g., an X-Y-Z Cartesian coordinate space). This allows the system to map a position of the sensors (e.g., an (X,Y,Z) position) in relation to the known magnetic field, and helps determine a position and/or orientation of the sensors. In one or more embodiments, the electromagnetic sensors 404a, 404b, etc. may be attached to one or more real objects. The electromagnetic sensors 404 may comprise smaller coils in which current may be induced through the emitted electromagnetic field. Generally the "sensor" components (404) may comprise small coils or loops, such as a set of three differently-oriented (e.g., such as orthogonally oriented relative to each other) coils coupled together within a small structure such as a cube or other container, that are positioned/oriented to capture incoming magnetic flux from the magnetic field emitted by the emitter (402), and by comparing currents induced through these coils, and knowing the relative positioning and orientation of the coils relative to each other, relative position and orientation of a sensor relative to the emitter may be calculated.

Figure 6:
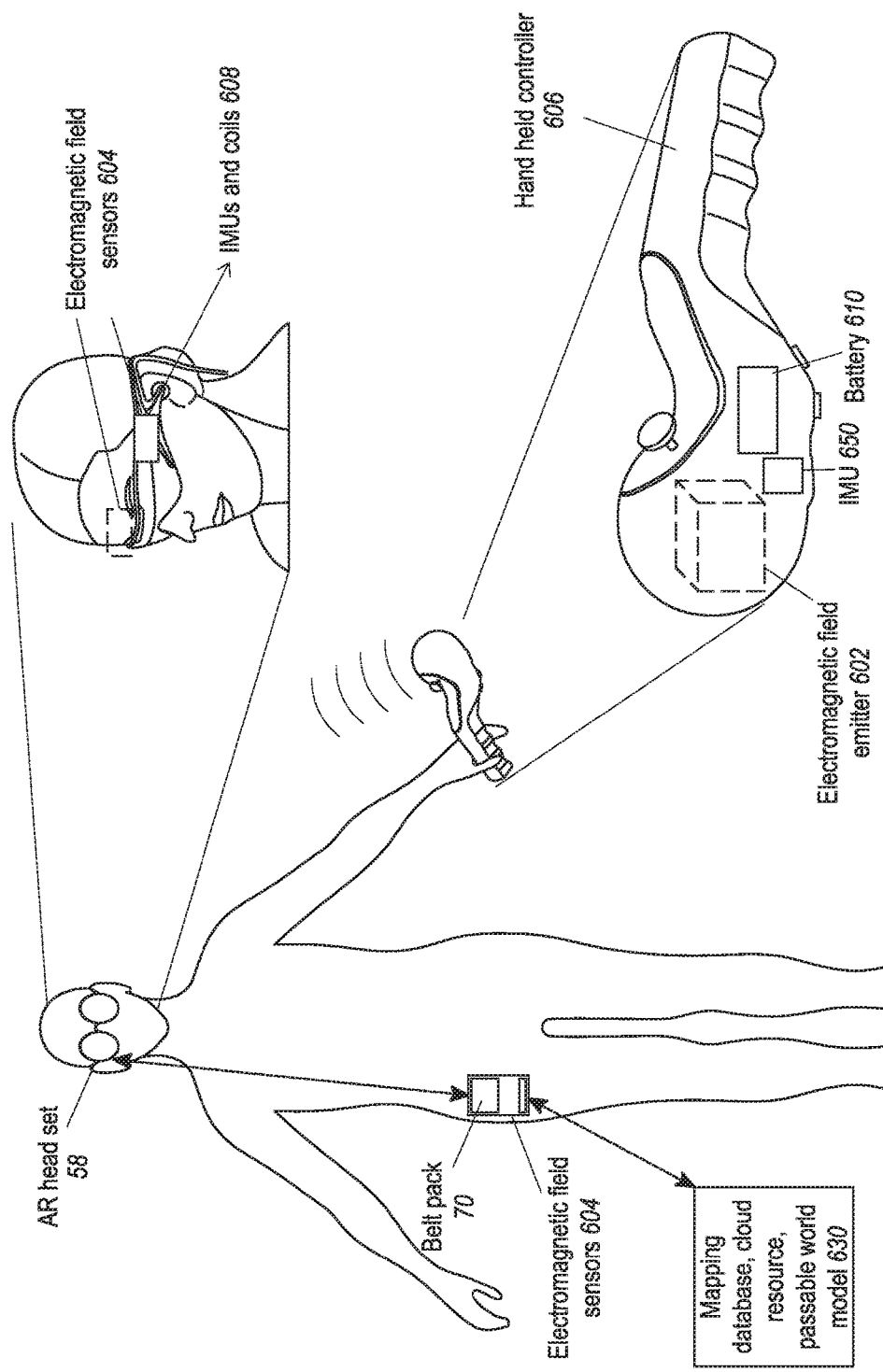
FIG. 6 schematically illustrates an example of an electromagnetic tracking system incorporated with an AR system.

One or more parameters pertaining to a behavior of the coils and inertial measurement unit ("IMU") components operatively coupled to the electromagnetic tracking sensors may be measured to detect a position and/or orientation of the sensor (and the object to which it is attached) relative to a coordinate system to which the electromagnetic field emitter is coupled. In one or more embodiments, multiple sensors may be used in relation to the electromagnetic emitter to detect a position and orientation of each of the sensors within the coordinate space. The electromagnetic tracking system may provide positions in three directions (e.g., X, Y and Z directions), and further in two or three orientation angles. In one or more embodiments, measurements of the IMU may be compared to the measurements of the coil to determine a position and orientation of the sensors. In one or more embodiments, both electromagnetic (EM) data and IMU data, along with various other sources of data, such as cameras, depth sensors, and other sensors, may be combined to determine the position and orientation. This information may be transmitted (e.g., wireless communication, Bluetooth, etc.) to the controller 406. In one or more embodiments, pose (or position and orientation) may be reported at a relatively high refresh rate in conventional systems. Conventionally an electromagnetic field emitter is coupled to a relatively stable and large object, such as a table, operating table, wall, or ceiling, and one or more sensors are coupled to smaller objects, such as medical devices, handheld gaming components, or the like. Alternatively, as described below in reference to FIG. 6, various features of the electromagnetic tracking system may be employed to produce a configuration wherein changes or deltas in position and/or orientation between two objects that move in space relative to a more stable global coordinate system may be tracked. In other words, a configuration is shown in FIG. 6 wherein a variation of an electromagnetic tracking system may be utilized to track position and orientation delta between a head-mounted component and a hand-held component, while head pose relative to the global coordinate system (say of the room environment local to the user) is determined otherwise, such as by simultaneous localization and mapping ("SLAM") techniques using outward-capturing cameras which may be coupled to the head mounted component of the system.

The controller 406 may control the electromagnetic field generator 402, and may also capture data from the various electromagnetic sensors 404. It should be appreciated that the various components of the system may be coupled to each other through any electro-mechanical or wireless/Bluetooth means. The controller 406 may also comprise data regarding the known magnetic field, and the coordinate space in relation to the magnetic field. This information is then used to detect the position and orientation of the sensors in relation to the coordinate space corresponding to the known electromagnetic field.

One advantage of electromagnetic tracking systems is that they produce highly accurate tracking results with minimal latency and high resolution. Additionally, the electromagnetic tracking system does not necessarily rely on optical trackers, and sensors/objects not in the user's line-of-vision may be easily tracked.

It should be appreciated that the strength of the electromagnetic field v drops as a cubic function of distance r from a coil transmitter (e.g., electromagnetic field emitter 402). Thus, an algorithm may be used based on a distance away from the electromagnetic field emitter. The controller 406 may be configured with such algorithms to determine a position and orientation of the sensor/object at varying distances away from the electromagnetic field emitter. Given the rapid decline of the strength of the electromagnetic field as the sensor moves farther away from the electromagnetic emitter, best results, in terms of accuracy, efficiency and low latency, may be achieved at closer distances. In typical electromagnetic tracking systems, the electromagnetic field emitter is powered by electric current (e.g., plug-in power supply) and has sensors located within 20 ft radius away from the electromagnetic field emitter. A shorter radius between the sensors and field emitter may be more desirable in many applications, including AR applications.

Figure 5:
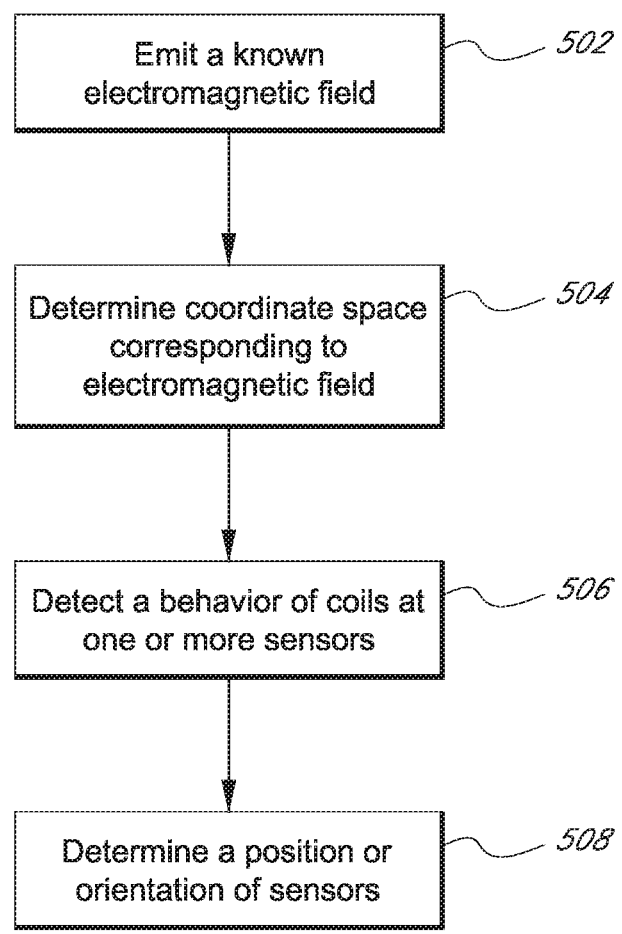
FIG. 5 is a flowchart describing example functioning of an embodiment of an electromagnetic tracking system.

With reference now to FIG. 5, an example flowchart describing a functioning of a typical electromagnetic tracking system is briefly described. At 502, a known electromagnetic field is emitted. In one or more embodiments, the magnetic field emitter may generate magnetic fields each coil may generate an electric field in one direction (e.g., X, Y or Z). The magnetic fields may be generated with an arbitrary waveform. In one or more embodiments, the magnetic field component along each of the axes may oscillate at a slightly different frequency from other magnetic field components along other directions. At 504, a coordinate space corresponding to the electromagnetic field may be determined. For example, the control 406 of FIG. 4 may automatically determine a coordinate space around the emitter based on the electromagnetic field. At 506, a behavior of the coils at the sensors (which may be attached to a known object) may be detected. For example, a current induced at the coils may be calculated. In other embodiments, a rotation of coils, or any other quantifiable behavior may be tracked and measured. At 508, this behavior may be used to detect a position or orientation of the sensor(s) and/or known object. For example, the controller 406 may consult a mapping table that correlates a behavior of the coils at the sensors to various positions or orientations. Based on these calculations, the position in the coordinate space along with the orientation of the sensors may be determined.

In the context of AR systems, one or more components of the electromagnetic tracking system may need to be modified to facilitate accurate tracking of mobile components. As described above, tracking the user's head pose and orientation may be desirable in many AR applications. Accurate determination of the user's head pose and orientation allows the AR system to display the right virtual content to the user. For example, the virtual scene may comprise a monster hiding behind a real building. Depending on the pose and orientation of the user's head in relation to the building, the view of the virtual monster may need to be modified such that a realistic AR experience is provided. Or, a position and/or orientation of a totem, haptic device or some other means of interacting with a virtual content may be important in enabling the AR user to interact with the AR system. For example, in many gaming applications, the AR system can detect a position and orientation of a real object in relation to virtual content. Or, when displaying a virtual interface, a position of a totem, user's hand, haptic device or any other real object configured for interaction with the AR system can be known in relation to the displayed virtual interface in order for the system to understand a command, etc. Conventional localization methods including optical tracking and other methods are typically plagued with high latency and low resolution problems, which makes rendering virtual content challenging in many augmented reality applications.

In one or more embodiments, the electromagnetic tracking system, discussed in relation to FIGS. 4 and 5 may be adapted to the AR system to detect position and orientation of one or more objects in relation to an emitted electromagnetic field. Typical electromagnetic systems tend to have a large and bulky electromagnetic emitters (e.g., 402 in FIG. 4), which is problematic for head-mounted AR devices. However, smaller electromagnetic emitters (e.g., in the millimeter range) may be used to emit a known electromagnetic field in the context of the AR system.

With reference now to FIG. 6, an electromagnetic tracking system may be incorporated with an AR system as shown, with an electromagnetic field emitter (602) incorporated as part of a hand-held controller 606. The controller 606 can be movable independently relative to the AR headset (or the belt pack 70). For example, the user can hold the controller 606 in his or her hand, or the controller could be mounted to the user's hand or arm (e.g., as a ring or bracelet or as part of a glove worn by the user). In one or more embodiments, the hand-held controller may be a totem to be used in a gaming scenario (e.g., a multi-degree-of-freedom controller) or to provide a rich user experience in an AR environment or to allow user interaction with an AR system. In other embodiments, the hand-held controller may be a haptic device. In yet other embodiments, the electromagnetic field emitter may simply be incorporated as part of the belt pack 70. The hand-held controller 606 may comprise a battery 610 or other power supply that powers that electromagnetic field emitter (602). It should be appreciated that the electromagnetic field emitter (602) may also comprise or be coupled to an IMU 650 component configured to assist in determining positioning and/or orientation of the electromagnetic field emitter (602) relative to other components. This may be especially advantageous in cases where both the field emitter (602) and the sensors (604) are mobile. Placing the electromagnetic field emitter (602) in the hand-held controller rather than the belt pack, as shown in the embodiment of FIG. 6, helps ensure that the electromagnetic field emitter is not competing for resources at the belt pack, but rather uses its own battery source at the hand-held controller 606. In yet other embodiments, the electromagnetic field emitter (602) can be disposed on the AR headset and the sensors 604 can be disposed on the controller 606 or belt pack 70.

In one or more embodiments, the electromagnetic sensors 604 may be placed on one or more locations on the user's headset, along with other sensing devices such as one or more IMUs or additional magnetic flux capturing coils 608. For example, as shown in FIG. 6, sensors (604, 608) may be placed on one or both sides of the head set (58). Since these sensors are engineered to be rather small (and hence may be less sensitive, in some cases), having multiple sensors may improve efficiency and precision. In one or more embodiments, one or more sensors may also be placed on the belt pack 70 or any other part of the user's body. The sensors (604, 608) may communicate wirelessly or through Bluetooth to a computing apparatus that determines a pose and orientation of the sensors (and the AR headset to which it is attached). In one or more embodiments, the computing apparatus may reside at the belt pack 70. In other embodiments, the computing apparatus may reside at the headset itself, or even the hand-held controller 606. The computing apparatus may in turn comprise a mapping database (e.g., passable world model, coordinate space, etc.) to detect pose, to determine the coordinates of real objects and virtual objects, and may even connect to cloud resources and the passable world model, in one or more embodiments.

As described above, conventional electromagnetic emitters may be too bulky for AR devices. Therefore the electromagnetic field emitter may be engineered to be compact, using smaller coils compared to traditional systems. However, given that the strength of the electromagnetic field decreases as a cubic function of the distance away from the field emitter, a shorter radius between the electromagnetic sensors 604 and the electromagnetic field emitter (602) (e.g., about 3 to 3.5 ft) may reduce power consumption when compared to conventional systems such as the one detailed in FIG. 4.

This aspect may either be utilized to prolong the life of the battery 610 that may power the controller 606 and the electromagnetic field emitter (602), in one or more embodiments. Or, in other embodiments, this aspect may be utilized to reduce the size of the coils generating the magnetic field at the electromagnetic field emitter (602). However, in order to get the same strength of magnetic field, the power may be need to be increased. This allows for a compact electromagnetic field emitter unit (602) that may fit compactly at the hand-held controller 606.

Several other changes may be made when using the electromagnetic tracking system for AR devices. Although this pose reporting rate is rather good, AR systems may require an even more efficient pose reporting rate. To this end, IMU-based pose tracking may (additionally or alternatively) be used in the sensors. Advantageously, the IMUs may remain as stable as possible in order to increase an efficiency of the pose detection process. The IMUs may be engineered such that they remain stable up to 50-100 milliseconds. It should be appreciated that some embodiments may utilize an outside pose estimator module (e.g., IMUs may drift over time) that may enable pose updates to be reported at a rate of 10 to 20 Hz. By keeping the IMUs stable at a reasonable rate, the rate of pose updates may be dramatically decreased to 10 to 20 Hz (as compared to higher frequencies in conventional systems).

If the electromagnetic tracking system can be run at, for example, a 10% duty cycle (e.g., only pinging for ground truth every 100 milliseconds), this would be another way to save power at the AR system. This would mean that the electromagnetic tracking system wakes up every 10 milliseconds out of every 100 milliseconds to generate a pose estimate. This directly translates to power consumption savings, which may, in turn, affect size, battery life and cost of the AR device.

In one or more embodiments, this reduction in duty cycle may be strategically utilized by providing two hand-held controllers (not shown) rather than just one. For example, the user may be playing a game that requires two totems, etc. Or, in a multi-user game, two users may have their own totems/hand-held controllers to play the game. When two controllers (e.g., symmetrical controllers for each hand) are used rather than one, the controllers may operate at offset duty cycles. The same concept may also be applied to controllers utilized by two different users playing a multi-player game, for example.

Figure 7:
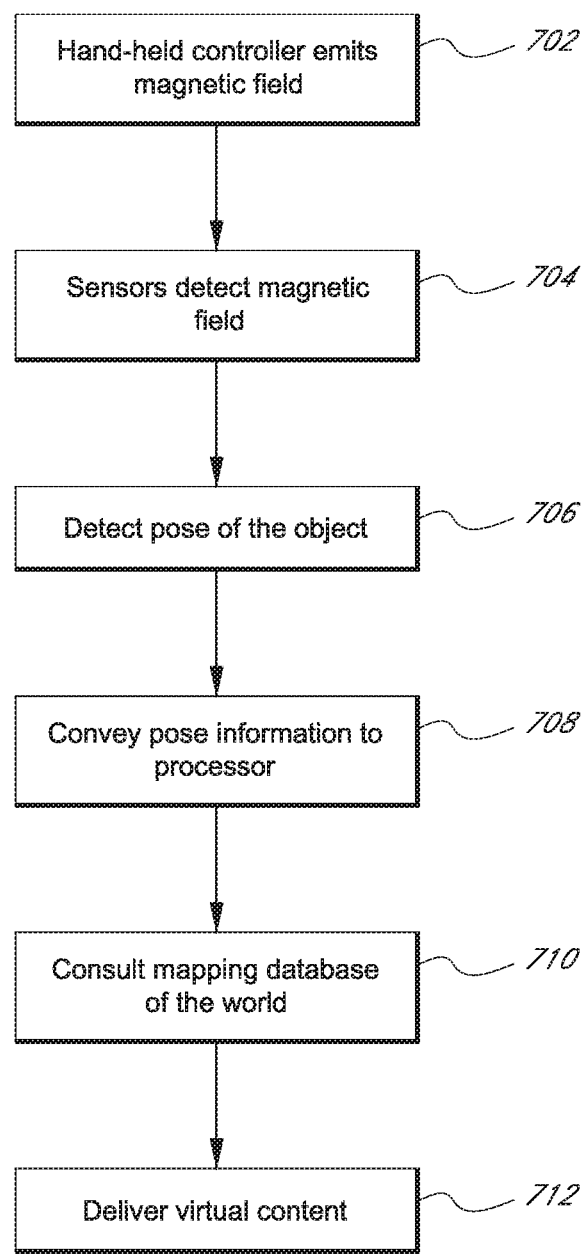
FIG. 7 is a flowchart describing functioning of an example of an electromagnetic tracking system in the context of an AR device.

With reference now to FIG. 7, an example flow chart describing the electromagnetic tracking system in the context of AR devices is described. At 702, a portable (e.g., hand-held) controller emits a magnetic field. At 704, the electromagnetic sensors (placed on headset, belt pack, etc.) detect the magnetic field. At 706, a pose (e.g., position or orientation) of the headset/belt is determined based on a behavior of the coils/IMUs at the sensors. At 708, the pose information is conveyed to the computing apparatus (e.g., at the belt pack or headset). At 710, optionally, a mapping database (e.g., passable world model) may be consulted to correlate the real world coordinates (e.g., determined for the pose of the headset/belt) with the virtual world coordinates. At 712, virtual content may be delivered to the user at the AR headset and displayed to the user (e.g., via the light field displays described herein). It should be appreciated that the flowchart described above is for illustrative purposes only, and should not be read as limiting.

Advantageously, using an electromagnetic tracking system similar to the one outlined in FIG. 6 enables pose tracking (e.g., head position and orientation, position and orientation of totems, and other controllers). This allows the AR system to project virtual content (based at least in part on the determined pose) with a higher degree of accuracy, and very low latency when compared to optical tracking techniques.

Figure 8:
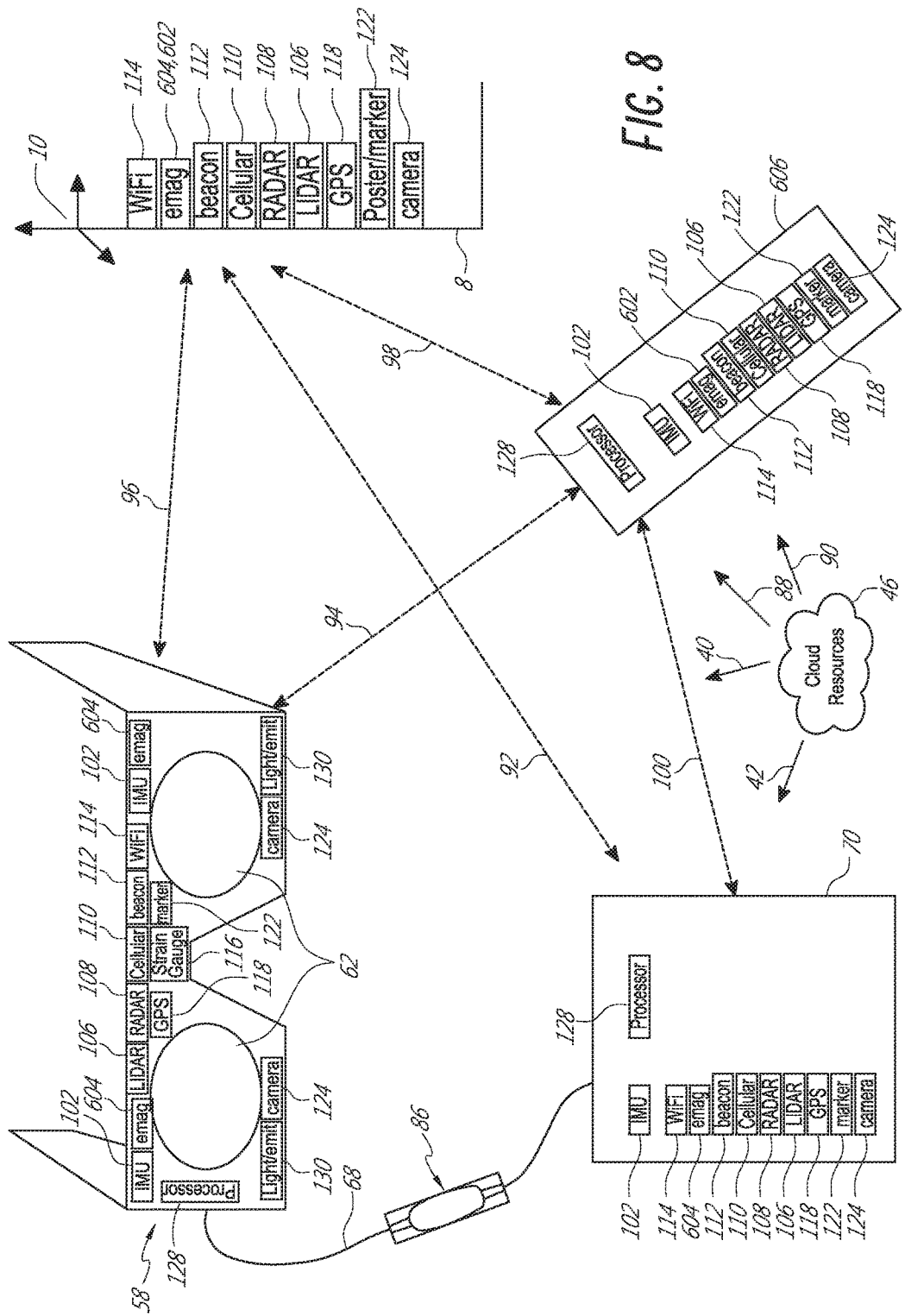
FIG. 8 schematically illustrates examples of components of an embodiment of an AR system.

With reference to FIG. 8, a system configuration is illustrated which features many sensing components. A head mounted wearable component (58) is shown operatively coupled (68) to a local processing and data module (70), such as a belt pack, here using a physical multicore lead which also features a control and quick release module (86) as described below in reference to FIGS. 9A-9F. The local processing and data module (70) is operatively coupled (100) to a hand held component (606), here by a wireless connection such as low power Bluetooth; the hand held component (606) may also be operatively coupled (94) directly to the head mounted wearable component (58), such as by a wireless connection such as low power Bluetooth. Generally where IMU data is passed to coordinate pose detection of various components, a high-frequency connection is desirable, such as in the range of hundreds or thousands of cycles/second or higher; tens of cycles per second may be adequate for electromagnetic localization sensing, such as by the sensor (604) and transmitter (602) pairings. Also shown is a global coordinate system (10), representative of fixed objects in the real world around the user, such as a wall (8).

Cloud resources (46) also may be operatively coupled (42, 40, 88, 90) to the local processing and data module (70), to the head mounted wearable component (58), to resources which may be coupled to the wall (8) or other item fixed relative to the global coordinate system (10), respectively. The resources coupled to the wall (8) or having known positions and/or orientations relative to the global coordinate system (10) may include a wireless transceiver (114), an electromagnetic emitter (602) and/or receiver (604), a beacon or reflector (112) configured to emit or reflect a given type of radiation, such as an infrared LED beacon, a cellular network transceiver (110), a RADAR emitter or detector (108), a LIDAR emitter or detector (106), a GPS transceiver (118), a poster or marker having a known detectable pattern (122), and a camera (124).

The head mounted wearable component (58) features similar components, as illustrated, in addition to lighting emitters (130) configured to assist the camera (124) detectors, such as infrared emitters (130) for an infrared camera (124); also featured on the head mounted wearable component (58) are one or more strain gauges (116), which may be fixedly coupled to the frame or mechanical platform of the head mounted wearable component (58) and configured to determine deflection of such platform in between components such as electromagnetic receiver sensors (604) or display elements (62), wherein it may be valuable to understand if bending of the platform has occurred, such as at a thinned portion of the platform, such as the portion above the nose on the eyeglasses-like platform depicted in FIG. 8.

The head mounted wearable component (58) also features a processor (128) and one or more IMUs (102). Each of the components preferably are operatively coupled to the processor (128). The hand held component (606) and local processing and data module (70) are illustrated featuring similar components. As shown in FIG. 8, with so many sensing and connectivity means, such a system is likely to be heavy, power hungry, large, and relatively expensive. However, for illustrative purposes, such a system may be utilized to provide a very high level of connectivity, system component integration, and position/orientation tracking. For example, with such a configuration, the various main mobile components (58, 70, 606) may be localized in terms of position relative to the global coordinate system using WiFi, GPS, or Cellular signal triangulation; beacons, electromagnetic tracking (as described herein), RADAR, and LIDAR systems may provide yet further location and/or orientation information and feedback. Markers and cameras also may be utilized to provide further information regarding relative and absolute position and orientation. For example, the various camera components (124), such as those shown coupled to the head mounted wearable component (58), may be utilized to capture data which may be utilized in simultaneous localization and mapping protocols, or "SLAM", to determine where the component (58) is and how it is oriented relative to other components.

Other features and embodiments of the head mounted wearable component (58) and its sensors are described in U.S. patent application Ser. No. 15/683,664, filed Aug. 22, 2017, and entitled "AUGMENTED REALITY DISPLAY DEVICE WITH DEEP LEARNING SENSORS," the entire contents of which are hereby incorporated by reference herein.

As discussed herein, the head mounted wearable AR/VR system (58) can include a variety of sensors for determining the location and/or orientation of the system within a three-dimensional space. For example, magnetic sensors and optical sensors can be used for this purpose. Suitable magnetic sensors may include magnetometers, such as the electromagnetic sensors (604) discussed above which can be used to help determine the location and/or orientation of the AR/VR system (58) based on detection of magnetic fields from an emitter (602). Another suitable magnetic sensor is a built-in magnetometer within the IMU (102) which can help determine the location and/or orientation of the AR/VR system (58) based on detection of the Earth's magnetic field. Meanwhile, suitable optical sensors can include, for example, outward-facing visible light or infrared cameras which can likewise be used to help determine the location and/or orientation of both the AR/VR system (58) and other objects.

When the wearable AR/VR system (58) uses multiple sensors, possibly of different types, to detect the position and/or orientation of the system itself or that of another object, it may be advantageous that the various sensors share a common alignment direction (or if not a common alignment direction, that the offset in alignment directions be known). This allows for the measurements taken by one of the sensors to be combined or compared with measurements taken by another one of the sensors in a consistent manner. However, manufacturing tolerances or other factors may result in unknown misalignments between the various sensors, thus causing registration errors when the measurements from those sensors are used to measure the position and/or orientation of the AR/VR system (58) itself or that of another object. Misalignments between the various magnetic and/or optical sensors of the AR/VR system (58) can be compensated for by using the alignment calibration systems and techniques described in this disclosure.

Figure 9:
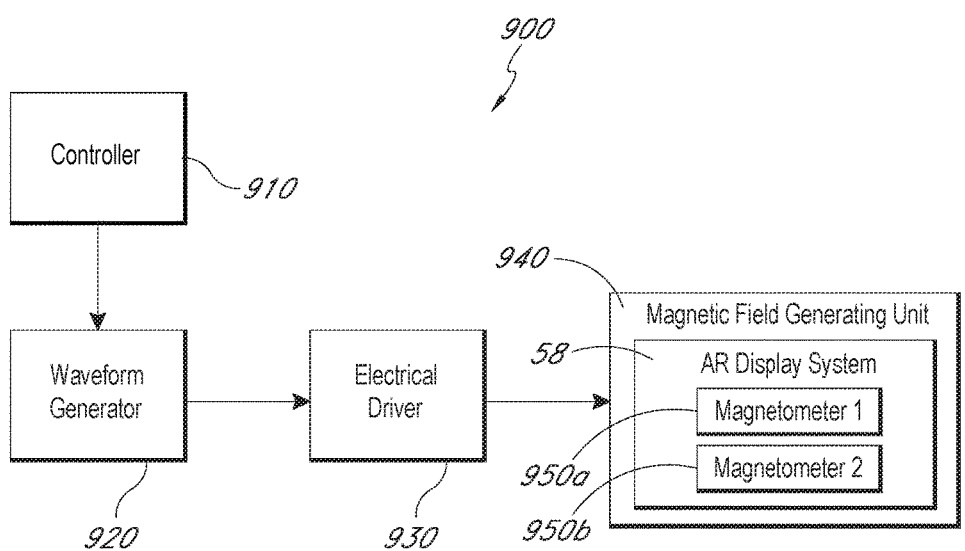
FIG. 9 is a block diagram of a system for calibrating the alignment of magnetometers in a head mounted wearable AR/VR system.
Figure 10A:
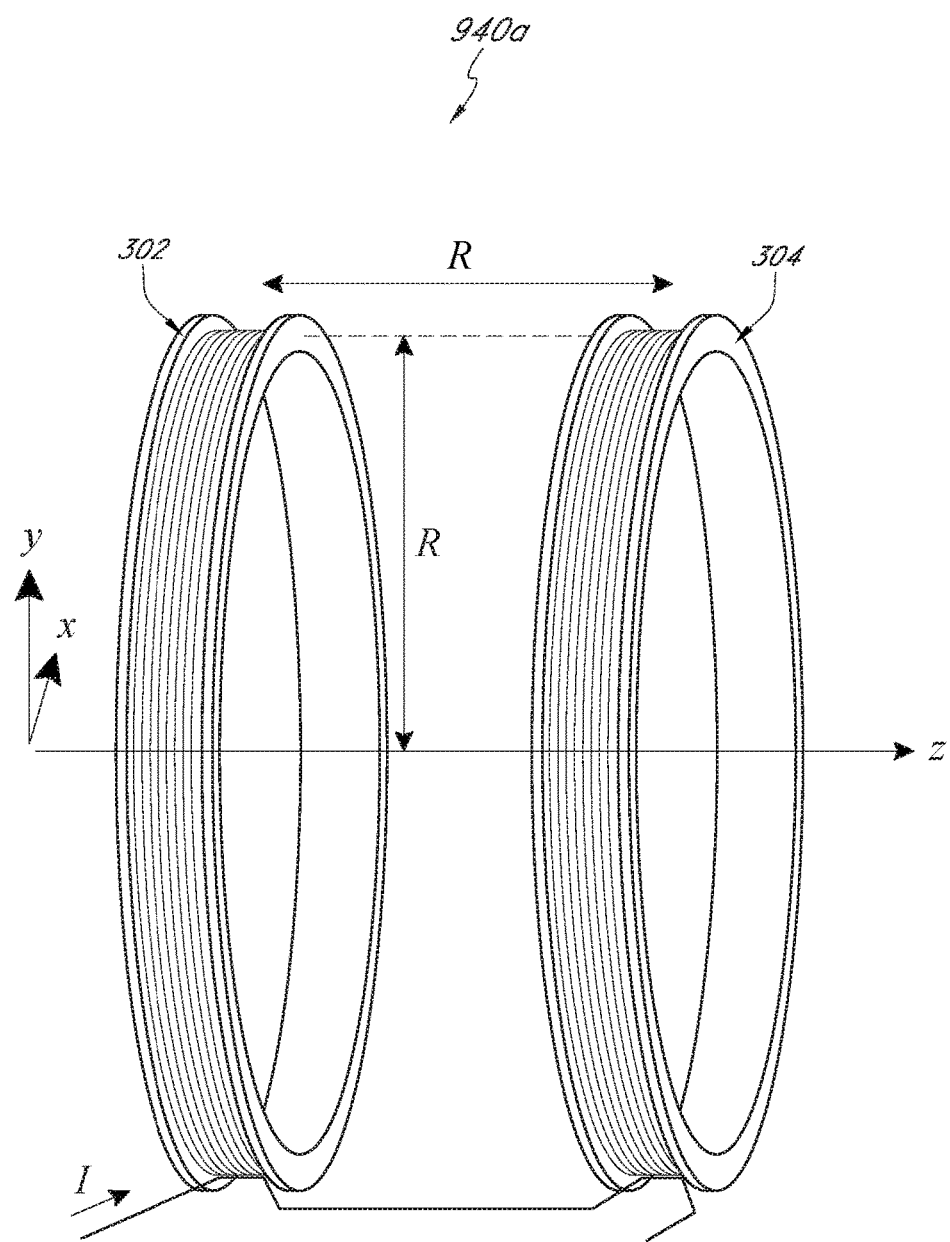
FIG. 10A illustrates a first example embodiment of the magnetic field generating unit shown in FIG. 9.
Figure 10B:
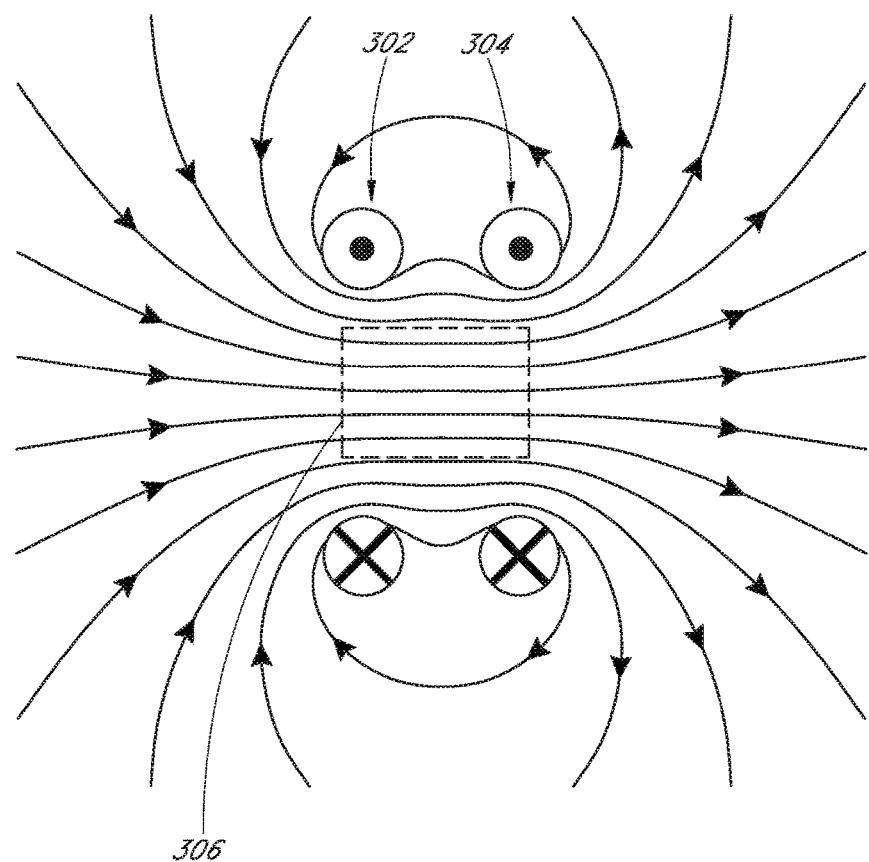
FIG. 10B is a cross-sectional schematic illustration of the magnetic field lines produced by the conductive loop configuration shown in FIG. 10A.
Figure 10C:
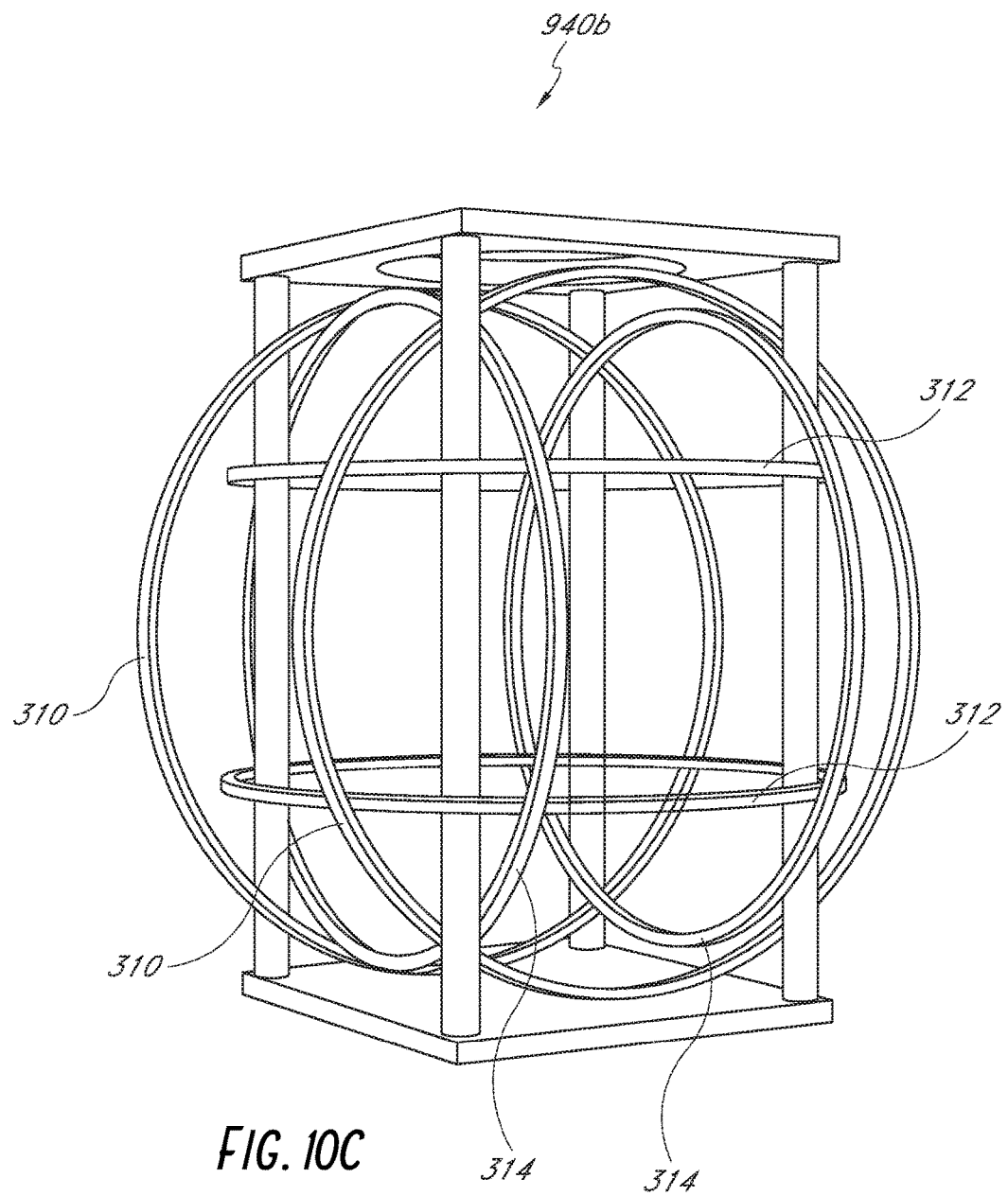
FIG. 10C illustrates an example multi-axis embodiment of the magnetic field generating unit shown in FIG. 9.

FIG. 9 is a block diagram of a system (900) for calibrating the alignment of magnetometers in a head mounted wearable AR/VR system (58). The calibration system (900) includes a magnetic field generating unit (940) to produce a magnetic field that is suitably uniform—in magnitude and/or direction—around the head mounted wearable AR/VR system (58) and its integrated magnetometers (950a, 950b). This uniform magnetic field can be used for the purpose of measuring or otherwise characterizing any differences that may exist between the magnitude and/or directional measurements output from each of the magnetometers (950a, 950b) when exposed to the magnetic field. Examples of the magnetic field generating unit (940) are illustrated in FIGS. 10A-10C. The calibration system (900) can also include a controller (910), a waveform generator (920), and an electrical driver (930) which can be used in conjunction with the magnetic field generating unit (940) to produce different types of magnetic fields based on the different types of magnetometers (950a, 950b) being calibrated for alignment.

FIG. 10A illustrates a first example embodiment (940a) of the magnetic field generating unit (940) shown in FIG. 9. In the illustrated embodiment, the magnetic field generating unit (940a) includes a first conductive loop (302) and a second conductive loop (304). In some embodiments, the conductive loops (302, 304) may each be coils of multiple turns of wire. The conductive loops (302, 304) may be circular, square, or have other shapes. In some embodiments, the two conductive loops (302, 304) have the same size and shape, though this is not necessarily required.

FIG. 10A shows the first and second conductive loops (302, 304) being oriented in parallel planes and spaced apart along a common axis. Specifically, each of the conductive loops (302, 304) is shown oriented in a plane parallel with the x-y plane and centered on the perpendicular z-axis. The conductive loops (302, 304) may be supported in place with respect to one another by a frame. The frame may be fixed or it may be movable to re-orient the conductive loops into different orientations with respect to the AR/VR system (58). Alternatively, the conductive loops may be mounted directly to, or otherwise integrated with, the AR/VR system (58). Such a configuration may allow for more regular calibration of the magnetometers (950a, 950b).

In the illustrated embodiment, the conductive loops (302, 304) are both circular with a common radius, R, and they are separated along the z-axis by a distance corresponding to the radius, R, of the conductive loops. (The separation distance along the z-axis may be measured, for example, from any given point on the first conductive loop (302) to a like point on the second conductive loop (304).) Each conductive loop (302, 304) can be a coil of wire with the same number of turns. The configuration shown in FIG. 10A is a Helmholtz coil configuration.

The conductive loops (302, 304) are electrically connected in series in a manner such that the electrical current, I, which passes through the first conductive loop (302) also passes through the second conductive loop (304) in the same direction. For example, if the conductive loops (302, 304) are each coils of wire, then both coils can be wrapped in the same direction such that the electrical current, I, flows around both conductive loops (302, 304) in a consistent direction.

The electrical current, I, can be provided by the electrical driver (930). The electrical driver (930) can include, for example, an amplifier which amplifies an electrical signal produced by the waveform generator (920). The waveform generator (920) can be one which is capable of producing a variety of electrical waveforms based on a control input from the controller (910). For example, the electrical waveforms can include a direct current (DC) electrical waveform (i.e., a constant waveform) and a variety of alternating current (AC) waveforms (i.e., time-varying waveforms, whether periodic or not). Each of these different electrical waveforms can be a calibration waveform used to produce a magnetic field in the magnetic field generating unit (940) which is well suited for calibration of one of the magnetometers (950a, 950b) which are being calibrated for alignment. The controller (910) can be a processing device which includes memory for storing calibration routines, calibration waveforms, etc. The controller (910) can also include an interface for receiving commands from a user or a device, such as the head mounted wearable AR/VR system (58), to carry out calibration routines. The controller (910) may also communicate with the wearable AR/VR system (58) to determine the specific magnetometer models which are to be calibrated. Based on this model information, the controller (910) can select one or more electrical calibration waveforms to use while calibrating each of the magnetometers.

Although only two conductive loops (302, 304) are illustrated in the embodiment shown in FIG. 10A, other embodiments may include different numbers of conductive loops. For example, as opposed to the Helmholtz coil configurations shown in FIGS. 10A-10C, the conductive loops can alternatively be arranged in a Merritt coil configuration or a Ruben coil configuration. Each of these configurations may employ square shaped conductive loops. In addition, these configurations may include more than two conductive coils. In the Merritt coil configuration, three or four square shaped conductive loops can be provided, with each conductive loop being separated from the adjacent loop along an axis by a distance corresponding to half the length of a side of the square shaped coil. In a Ruben coil configuration, a fifth conductive loop can be added and different separation distances can be used between loops. The spacings between conductive loops and/or the ratios of the number of turns of wire provided in each conductive loop can be determined using mathematical formulas known in the art. Although different coil configurations can be used in different embodiments of the magnetic field generating unit (940), in general the configuration of conductive loops is selected so as to generate a magnetic field whose uniformity is sufficient for the application at hand. If a more uniform magnetic field is needed for a particular application than a certain embodiment of the magnetic field generating unit (940) can provide, then increasing the size of the conductive loops can result in improved magnetic field uniformity within a given volume of space.

FIG. 10B is a cross-sectional schematic illustration of the magnetic field lines produced by the conductive loop configuration shown in FIG. 10A. The drawing shows a top section (with a dot) and a bottom section (with an "x") for each of the conductive loops (302, 304). These markings illustrate that the electrical current, I, passes through both the first conductive loop (302) and the second conductive loop (304) in a manner such that it exits the page at the top sections of the conductive loops and goes into the page at the bottom sections of the conductive loops. This produces a left-to-right magnetic field in the volume of space (306) inside the loops. The magnetic field within the test volume of space (306) is uniform in both magnitude and direction, thus making it possible to perform consistent calibration measurements using the magnetometers (950a, 950b) of the AR/VR system (56) located in that space.

The arrangement of conductive loops shown in FIGS. 10A and 10B produces a magnetic field in a single direction within the test volume (306). However, the magnetometers (950a, 950b) in the AR/VR system (58) may be multi-axis sensors capable of measuring magnetic fields in multiple directions (e.g., three orthogonal directions). Thus, in some embodiments, the magnetic field generating unit (940) may be designed to produce uniform magnetic fields in more than one direction so as to facilitate calibration of multi-axis sensors.

FIG. 10C illustrates an example multi-axis embodiment (940b) of the magnetic field generating unit (940) shown in FIG. 9. The multi-axis embodiment (940b) includes a first pair (310) of conductive loops oriented in parallel planes and spaced apart along a common first axis (e.g. the x-axis). It also includes a second pair (312) of conductive loops which are likewise oriented in parallel planes and spaced apart along a common second axis (e.g. the y-axis) and a third pair (314) of conductive loops which are oriented in parallel planes and spaced apart along a common third axis (e.g. the z-axis). The first axis, the second axis, and the third axis are all orthogonal to one another. Each pair of loops (310, 312, 314) generates a uniform magnetic field in a direction along the longitudinal axis of the pair of loops and orthogonal to the magnetic fields produced by the other pairs of loops. While FIG. 10C shows each pair of conductive loops arranged in a Helmholtz coil configuration, with circular loops spaced apart by a distance corresponding to the radius of the loops, other embodiments of the multi-axis magnetic field generating unit may use other configurations of conductive loops to produce the uniform magnetic fields. As illustrated, the multi-axis embodiment (940b) of the magnetic field generating unit (940) may also include a frame to support the various conductive loops in position with respect to one another.

Figure 11:
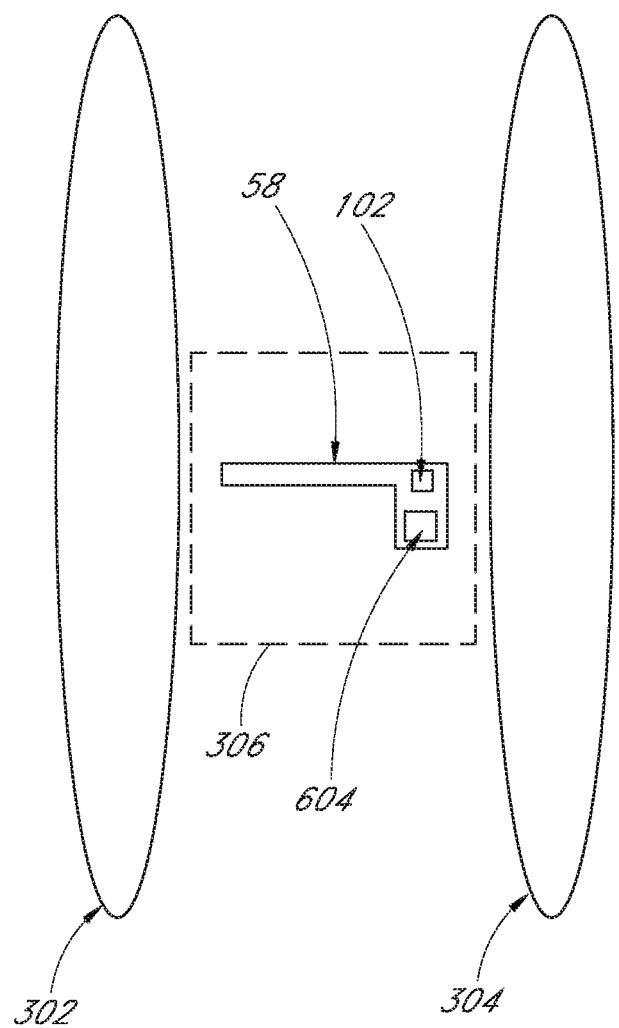
FIG. 11 is a schematic illustration of the head mounted wearable AR/VR system positioned in the test volume of a uniform magnetic field produced by the first conductive loop and the second conductive loop.

FIG. 11 is a schematic illustration of the head mounted wearable AR/VR system (58) positioned in the test volume (306) of the uniform magnetic field produced by the first conductive loop (302) and the second conductive loop (304). In some embodiments, the test volume (306) is a cubic space with sides that are at least about 30 cm, though other sizes may be used in other embodiments. The illustrated AR/VR system (58) includes two magnetometers. In this embodiment, the first magnetometer is the electromagnetic sensor (604) described herein. As already discussed, the electromagnetic sensor (604) may include one or more coils which inductively generate a current in response to magnetic field(s) passing through the coils. A current is only induced in response to a changing magnetic field. Since the electromagnetic sensor (604) measures the strength and/or orientation of a magnetic field based on the induced current(s), this type of magnetometer measures changing magnetic fields (whether time varying or spatially varying). A changing magnetic field is therefore needed in order to calibrate this type of magnetometer using the magnetic field generating unit (940). The illustrated AR/VR system (58) in FIG. 11 also includes an IMU (102). The IMU (102) can include a DC magnetometer capable of measuring static magnetic fields, such as the Earth's local magnetic field. For example, the magnetometer in the IMU (102) may be a Hall Effect magnetometer. A static magnetic field may therefore be needed in order to calibrate this type of magnetometer using the magnetic field generating unit (940). Other types of magnetometers may have different properties such that calibration of these magnetometers may benefit from magnetic fields with other characteristics. The calibration system (900) can advantageously produce magnetic fields with a variety of properties to suit a variety of types of magnetometers.

A mount can be provided for supporting the wearable AR/VR system (58) within the test volume (306) of the magnetic field generating unit (940). In some embodiments, the mount may be fixed, while in other embodiments the mount may be movable (e.g., electro-mechanically movable, using one or more motors, actuators, etc.) so as to reposition the wearable AR/VR system (58) within the test volume (306). For example, a calibration operation can be performed with the wearable AR/VR system (58) positioned such that a first measurement axis of the magnetometers is generally aligned with the magnetic field(s) produced by the magnetic field generating unit (940). Then, the wearable AR/VR system (58) can be repositioned such that a second measurement axis of the magnetometers is generally aligned with the magnetic field(s) and a second calibration operation can be performed. This procedure can be repeated for each measurement axis of the magnetometers. In this way, multi-axis magnetometers can be calibrated even with a single axis magnetic field generating unit (940). In such embodiments, the orientation of the movable mount can be controlled by the controller (910). A similar procedure can be employed by instead moving the orientation of the magnetic field generating unit (940) (e.g., with a movable frame using one or more motors, actuators, etc.) with respect to the wearable AR/VR system (58).

Figure 12:
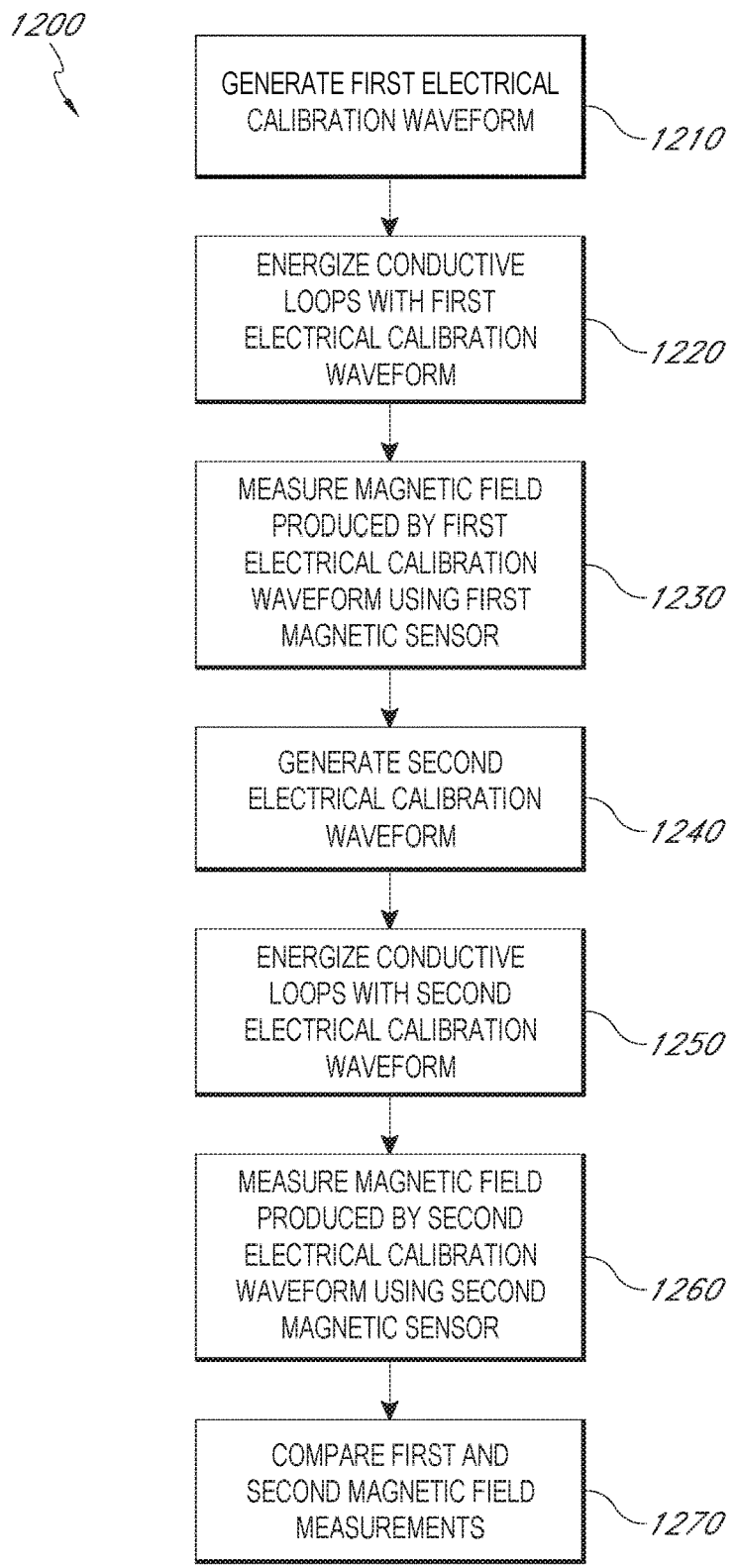
FIG. 12 is a flow chart of an example method for calibrating the alignment of two different types of magnetometers in a wearable AR/VR system.

FIG. 12 is a flow chart of an example method (1200) for calibrating the alignment of two different types of magnetometers in a wearable AR/VR system (58). The method (1200) begins at block 1210 where the controller (910) issues a command to the waveform generator (920) to produce a first electrical calibration waveform. The properties of the first electrical calibration waveform (e.g., magnitude, frequency, etc.) may be selected based on the detection properties of the first type of magnetometer to be calibrated. For example, the first electrical calibration waveform may be a periodic AC electrical waveform with a selected frequency that is tuned to the magnetometer whose alignment is being calibrated. At block 1220, the electrical driver (930) energizes the conductive loops of the magnetic field generating unit (940) with an electrical current, I, corresponding to the first electrical calibration waveform. Since the first electrical calibration waveform is an AC waveform, a time-varying AC magnetic field is produced by the magnetic field generating unit (940). At block 1230, while the conductive loops are energized, a first magnetometer, such as the electromagnetic sensor (604), measures the generated magnetic field based on one or more currents induced in the electromagnetic sensor (604) by the AC magnetic field. The measurement can be of the strength and/or direction of the magnetic field produced by the magnetic field generating unit (940). The measurement(s) can then be stored in a memory of the AR/VR system (58).

At block 1240 of the method (1200), the controller (910) issues a command to the waveform generator (920) to produce a second electrical calibration waveform. The properties of the second electrical calibration waveform (e.g., magnitude, frequency, etc.) may be selected based on the detection properties of the second type of magnetometer to be calibrated. For example, the second electrical calibration waveform may be a DC electrical waveform. At block 1250, the electrical driver (930) energizes the conductive loops of the magnetic field generating unit (940) with an electrical current corresponding to the second electrical calibration waveform. Since the second electrical calibration waveform is a DC waveform, it likewise produces a DC magnetic field. At block 1260, while the conductive loops are energized, a second magnetometer, such as the IMU (102), measures the generated magnetic field. The measurement can be of the strength and/or direction of the magnetic field produced by the magnetic field generating unit (940). These measurement(s) can likewise be stored in a memory of the AR/VR system (58). In some embodiments, the IMU (102)—or another device—can be used to determine the Earth's local magnetic field by performing a measurement in the absence of the calibration magnetic field produced using the second electrical calibration waveform. The Earth's local magnetic field can then be removed from the IMU's measurement of the calibration magnetic field (e.g., by vector subtraction). Alternatively, a measurement of the Earth's local magnetic field can be made—by the IMU (102) or a separate device—and the magnetic field generating unit (940) can be used to cancel out the Earth's local magnetic field (e.g., by producing a magnetic field equal in magnitude and opposite in direction) while the IMU (102) is measuring the calibration magnetic field produced using the second electrical calibration waveform.

As briefly discussed already, the first and second electrical calibration waveforms can be selected by the controller (910) so as to produce respective magnetic fields which are directly measurable by a first type of magnetometer and a different second type of magnetometer. Since different types of magnetometers function based on different physical principles, different magnetometers may detect different types of magnetic fields with distinct properties, or different types of magnetic fields may be better suited to different magnetometers. The first calibration waveform may be distinct from the second calibration waveform and may have one or more properties (e.g., magnitude, frequency, etc.) which are measurable by the first type of magnetometer but not by the second, or which are more readily measurable by the first type of magnetometer than by the second. Similarly, the second calibration waveform may be distinct from the first calibration waveform and may have one or more properties (e.g., magnitude, frequency, etc.) which are measurable by the second type of magnetometer but not by the first, or which are more readily measurable by the second type of magnetometer than by the first.

Although the first and second electrical calibration waveforms which are used to calibrate the magnetometers (102, 604) may have different properties, they are nonetheless generated by the same magnetic field generating unit (940) and with the same orientation. Accordingly, the alignment direction of the magnetic fields produced using each of the first and second electrical calibration waveforms are physically registered with one another. The measurements produced by the first and second magnetometers (102, 604) can therefore be used to produce one or more calibration/correction values which may characterize any difference(s) in the alignment orientation of the two magnetometers. Indeed, the production of one or more such values is what occurs at block 1270 of the calibration method (1200).

At block 1270, the measurement(s) obtained from the first and second magnetometers (102, 604) are compared (e.g., using one or more mathematical operations) in order to generate one or more calibration/correction values. This calculation can be performed by, for example, the wearable AR/VR system (58). As an example, the first and second magnetometers (102, 604) may both generate measurements of the direction of the respective applied magnetic fields. If the direction measurements differ, an offset angle (in one or more dimensions) between the direction measurements can be determined. This offset angle can then be used to specify one or more calibration values which may be applied to the measurements produced by either or both of the magnetometers (102, 604) while the wearable AR/VR system (58) is in use. For example, all of the measurements produced by one of the magnetometers may be adjusted based on the offset angle, or other calibration/correction value, before the data is used or otherwise acted upon by the AR system.

The calibration method (1200) can be repeated for each measurement axis of the magnetometers (102, 604). As already discussed, this can be accomplished by either re-orienting the wearable AR/VR system (58) or the magnetic field generating unit (940) with respect to the other for each measurement axis of the magnetometers (102, 604). Alternatively, if the multi-axis embodiment (940b) of the magnetic field generating unit (940) is used, then the calibration method can simply be performed for each of the conductive loop pairs (310, 312, 314). The same electrical calibration waveform can be used for each measurement axis or different waveforms can be used for different measurement axes. Furthermore, although the magnetic fields which are generated for the calibration of each magnetometer, or each measurement axis of the magnetometers, can be applied at different times, it may also be possible to apply the magnetic fields concurrently or at partially overlapping times. For example, if one magnetometer only detects AC magnetic fields and the other only detects DC magnetic fields, then it may be possible to apply both the AC magnetic field and the DC magnetic field at the same time so as to speed up the calibration process.

Figure 13:
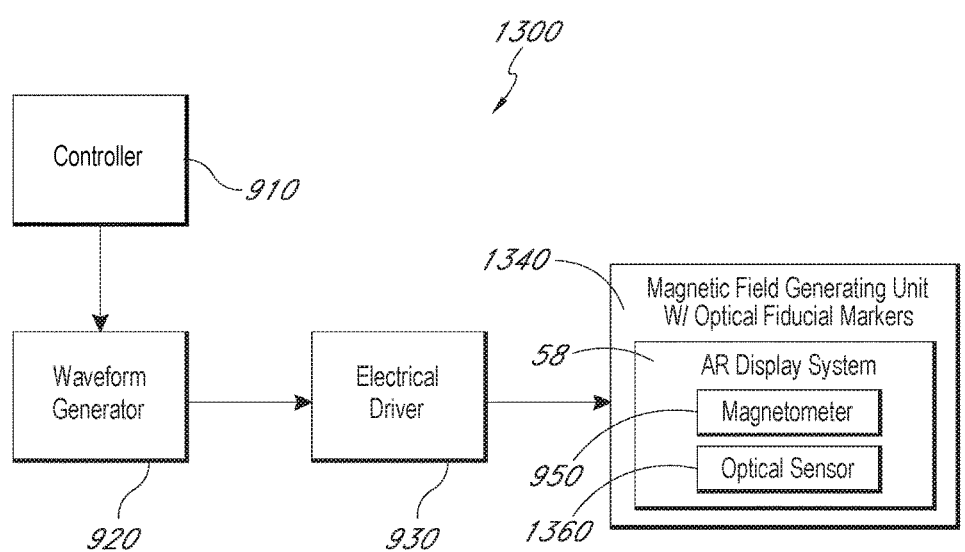
FIG. 13 is a block diagram of a system for calibrating the alignment of magnetometers and optical sensors in a head mounted wearable AR/VR system.
Figure 14:
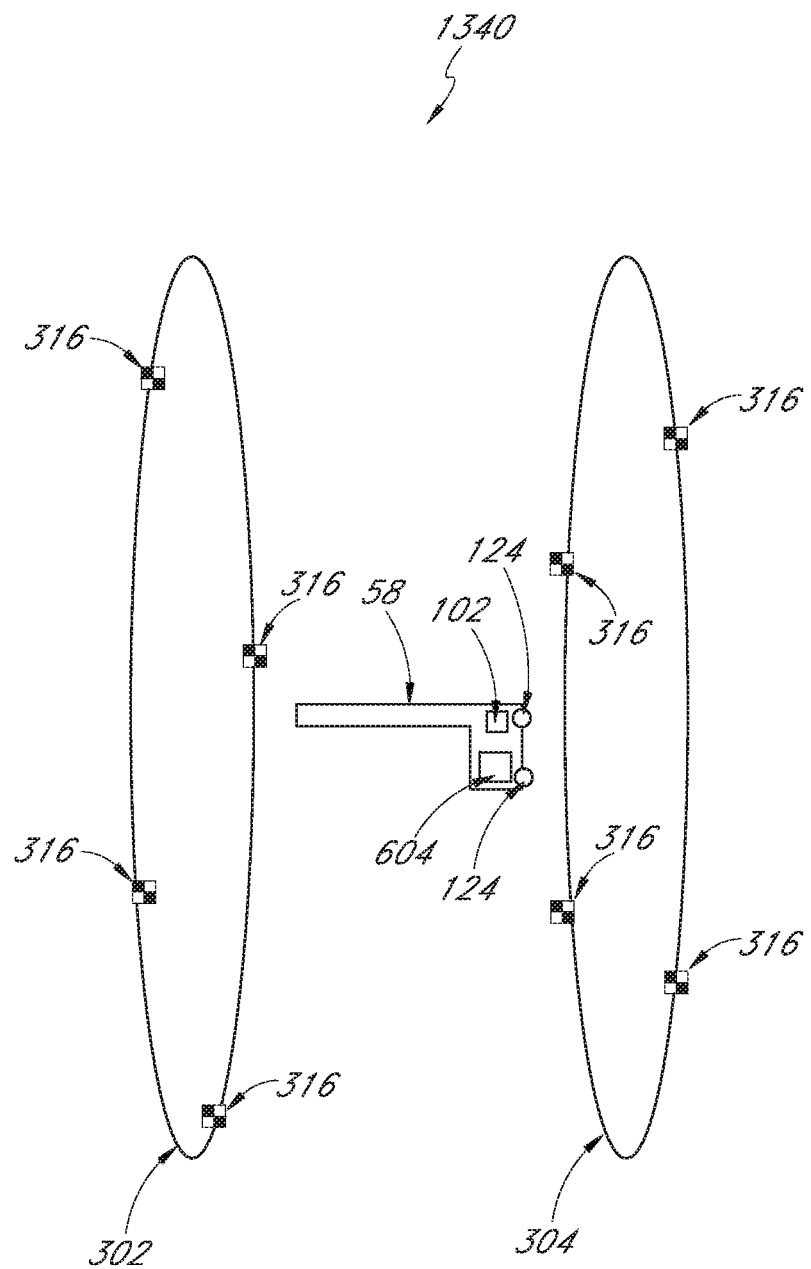
FIG. 14 is a schematic illustration of the head mounted wearable AR/VR system positioned in an example embodiment of the magnetic field generating unit with optical fiducial markers.
Figure 15:
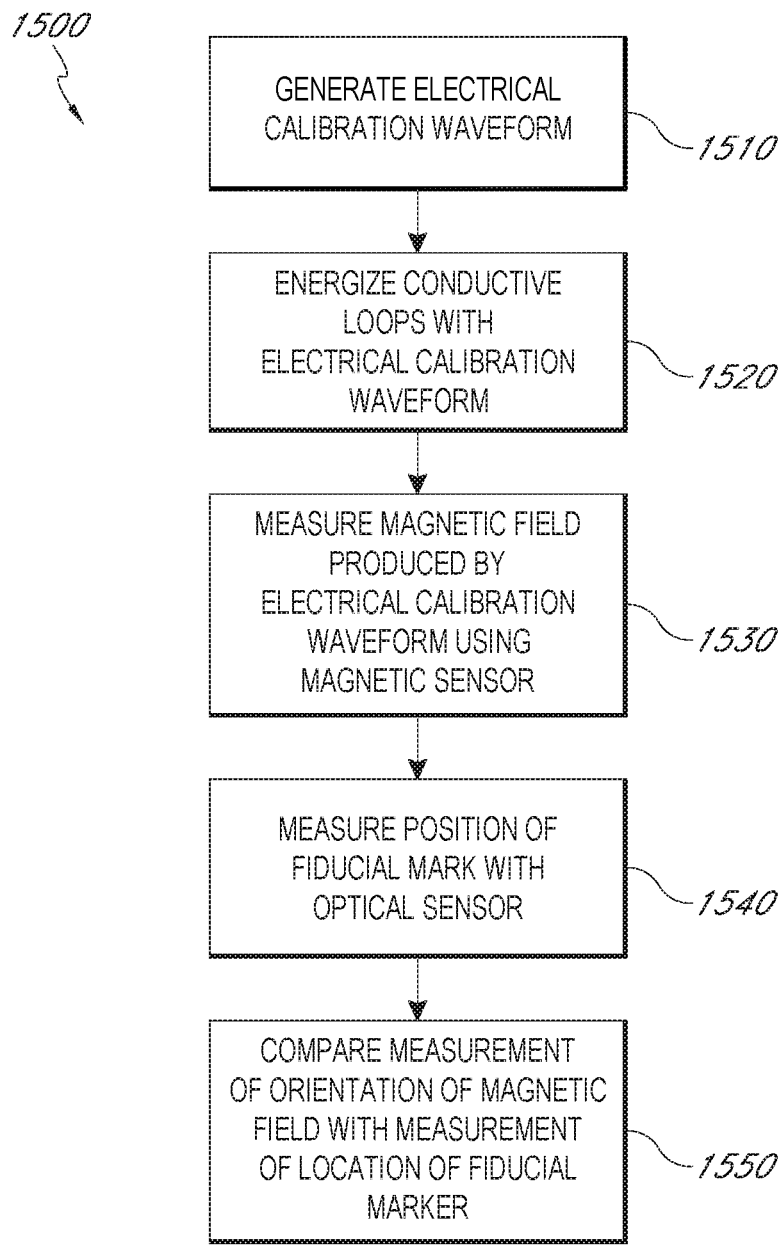
FIG. 15 is a flow chart of an example method for calibrating the alignment of magnetic sensors and optical sensors in a wearable AR/VR system.

As already discussed, in some embodiments a combination of magnetic and optical sensors are used to determine the position and/or orientation of the wearable AR/VR system (58). FIGS. 13-15 therefore illustrate systems and methods for calibrating the alignment direction of both magnetic sensors and optical sensors.

FIG. 13 is a block diagram of a system (1300) for calibrating the alignment of magnetometers and optical sensors in a head mounted wearable AR/VR system (58). Like the calibration system (900) shown in FIG. 9, the calibration system (1300) shown in FIG. 13 includes a magnetic field generating unit (1340) to produce a uniform magnetic field around the head mounted wearable AR/VR system (58) and its integrated magnetometer(s) (950). The calibration system (1300) can also include a controller (910), a waveform generator (920), and an electrical driver (930). These components can all function as described above. However, the magnetic field generating unit (1340) can also include one or more optical fiducial markers. The optical fiducial markers can have calibrated position(s) and/or orientation(s) with respect to the magnetic field produced by the magnetic field generating unit (1340). Thus, both magnetic sensors (950) and optical sensors (1360) can be calibrated using this system (1300).

FIG. 14 is a schematic illustration of the head mounted wearable AR/VR system (58) positioned in an example embodiment of the magnetic field generating unit with optical fiducial markers (1340). As illustrated, the magnetic field generating unit (1340) can include a first conductive loop (302) and a second conductive loop (304). These conductive loops (302, 304) can be used to apply one or more magnetic fields which can then be measured by the magnetometers (102, 604) integrated with the wearable AR/VR system (58), as already discussed herein.

But the magnetic field generating unit (1340) can also include one or more optical fiducial markers (316). The optical fiducial markers (316) may be any mark recognizable by an optical sensor, such as a camera. The optical fiducial markers (316) may have flat features, such as checkerboards or Aruco markers, or they may have textured or otherwise three-dimensional features. The optical fiducial markers (316) may be static or dynamic (e.g., changing markers presented by electronic displays, etc.). In some embodiments, the optical fiducial markers (316) may be etched into a substrate material or they may be formed with coatings or anodizing.

The optical fiducial markers (316) can be supported by a frame or other support structure, or the fiducial markers (316) can be mounted to the conductive loops (302, 304) themselves. In any case, however, the spatial relationship(s) (e.g., location and/or orientation) of the fiducial marker(s) (316) can be registered with respect to the axis of the conductive loops (302, 304). The location(s) and/or orientation(s) of the fiducial marker(s) (316) can be detected and measured by one or more optical sensors (1360) integrated with the wearable AR/VR system (58). In some embodiments, the optical sensors (1360) may be infrared or visible light cameras (124). The configuration illustrated in FIG. 14 provides an opportunity to ensure that the magnetic sensors (102, 604) are aligned in a known way with the optical sensors (124).

FIG. 15 is a flow chart of an example method (1500) for calibrating the alignment of magnetic sensors and optical sensors in a wearable AR/VR system (58). The method (1500) begins at block 1510 where the controller (910) issues a command to the waveform generator (920) to produce an electrical calibration waveform. At block 1520, the electrical driver (930) energizes the conductive loops (302, 304) of the magnetic field generating unit (1340) with an electrical current, I, corresponding to the electrical calibration waveform. At block 1530, while the conductive loops are energized, a magnetometer (e.g., the electromagnetic sensor (604) or the IMU (102)) measures the magnitude and/or direction of the magnetic field produced by the magnetic field generating unit (1340). The measurement(s) can then be stored in a memory of the AR/VR system (58).

At block 1540, one or more of the optical sensors (e.g. cameras (124)) in the wearable AR/VR system (58) perform measurements of the position(s) and/or orientation(s) of the optical fiducial marker(s) (316). This information can be used to determine an alignment direction of each optical sensor using camera extrinsic calibration algorithms. These measurements can then likewise be stored in a memory of the AR/VR system (58). The measurements by the optical sensors can be performed before, during, or after magnetic field measurements performed by the magnetometers.

Then, at block 1550, the measurement(s) obtained from a magnetometers (e.g., 102, 604) can be compared (e.g., using one or more mathematical operations) to those obtained from an optical sensor (1360) in order to generate one or more calibration correction values. This calculation can be performed by, for example, the wearable AR/VR system (58). As an example, a magnetometer (e.g., 102, 604) may generate measurements of the direction of the applied magnetic field. These measurements may correspond to an indication of the alignment direction of the magnetometer. Meanwhile, an optical sensor (1360) may generate measurements of its alignment direction based on its detected spatial relationship with respect to the optical fiducial markers (316). If the direction measurements differ, an offset angle (in one or more dimensions) between the direction measurements can be determined. This offset angle can then be used to specify one or more calibration correction values which may be applied to the measurements produced by either or both the magnetometer and the optical sensor while the wearable AR/VR system (58) is in use. For example, all of the measurements produced by the magnetometer and/or the optical sensor may be adjusted based on the offset angle, or other calibration correction value, before the data is used or otherwise acted upon by the AR/VR system.

In a factory calibration setting, a plurality of calibration systems (e.g., 900, 1300), such as those described herein, may be located adjacent one another. The operation of the calibration systems may be timed such that adjacent systems do not produce magnetic fields that would interfere with readings at an adjacent system. In some embodiments, a group of calibration systems may be time sequenced, while in other embodiments every other calibration station, or every second, or every third, etc., may be simultaneously operated to provide functional separation.

Additional Considerations

Each of the processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity. It is further noted that the claims may be drafted to exclude any optional element.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A system for calibrating alignment of two or more magnetic sensors in a virtual reality (VR) or augmented reality (AR) display device, the system comprising:
   a controller;
   a waveform generator configured to generate a first calibration waveform and a second calibration waveform under control of the controller;
   a first conductive loop oriented in a first plane orthogonal to a first axis passing through the first conductive loop;
   a second conductive loop oriented in a second plane parallel to the first plane and spaced apart from the first conductive loop along the first axis; and
   an electrical driver connected to the waveform generator to receive the first and second calibration waveforms, to generate corresponding first and second electrical output currents, and to provide the first and second electrical output currents to the first conductive loop and the second conductive loop,
   wherein the controller is configured to cause the waveform generator to generate the first calibration waveform to calibrate a first type of magnetic sensor in the display device, and to generate the second calibration waveform to calibrate a second type of magnetic sensor in the display device.

2. The system of claim 1, wherein the controller is configured to communicate with the display device to identify the magnetic sensors to be calibrated, and to select the first and second calibration waveforms based on the identification of the magnetic sensors.

3. The system of claim 1, wherein the first type of magnetic sensor comprises an inductive magnetometer and the first calibration waveform comprises an alternating current waveform.

4. The system of claim 1, wherein the second type of magnetic sensor comprises a static field magnetometer and the second calibration waveform comprises a direct current waveform.

5. The system of claim 1, wherein the first conductive loop and the second conductive loop are connected to the electrical driver such that the electrical output current travels in the same direction around both the first conductive loop and the second conductive loop.

6. The system of claim 1, wherein the first conductive loop and the second conductive loop have the same shape.

7. The system of claim 1, wherein the first conductive loop and the second conductive loop have the same size.

8. The system of claim 7, wherein the first conductive loop and the second conductive loop are circular and have a radius, the first conductive loop and the second conductive loop being spaced apart along the first axis by a distance corresponding to the radius.

9. The system of claim 1, further comprising a mount configured to attach to the display device and to support it in a first predetermined spatial relationship with respect to the first and second conductive loops.

10. The system of claim 9, further comprising an actuator connected to the mount and configured to move the display device to a second predetermined spatial relationship with respect to the first and second conductive loops.

11. The system of claim 1, further comprising:
   a third conductive loop oriented in a third plane orthogonal to a second axis passing through the third conductive loop, the second axis being orthogonal to the first axis;
   a fourth conductive loop oriented in a fourth plane parallel to the third plane and spaced apart from the third conductive loop along the second axis.

12. The system of claim 11, further comprising:
   a fifth conductive loop oriented in a fifth plane orthogonal to a third axis passing through the fifth conductive loop, the third axis being orthogonal to the first and second axes;
   a sixth conductive loop supported by the frame and oriented in a sixth plane parallel to the fifth plane and spaced apart from the fifth conductive loop along the third axis.

13. The system of claim 1, wherein the system is further configured to calibrate alignment of an optical sensor, the system further comprising one or more optical fiducial markers oriented in a predetermined spatial relationship with respect to the first conductive loop and the second conductive loop.

14. The system of claim 13, wherein the optical sensor comprises a camera.

15. The system of claim 13, wherein the one or more optical fiducial markers include two-dimensional or three-dimensional features.

16. A system for calibrating alignment of one or more magnetic sensors and one or more optical sensors in a virtual reality (VR) or augmented reality (AR) display device, the system comprising:
   a first conductive loop oriented in a first plane orthogonal to a first axis passing through the first conductive loop;
   a second conductive loop oriented in a second plane parallel to the first plane and spaced apart from the first conductive loop along the first axis; and
   one or more optical fiducial markers supported in a predetermined spatial relationship with respect to the first conductive loop and the second conductive loop.

17. The system of claim 16, wherein the one or more optical fiducial markers are mounted to the first conductive loop or the second conductive loop.

18. The system of claim 16, further comprising:
   a controller;
   a waveform generator configured to generate a calibration waveform under control of the controller; and
   an electrical driver connected to the waveform generator to receive the calibration waveform, to generate a corresponding electrical output current, and to provide the electrical output current to the first conductive loop and the second conductive loop.

19. A method for calibrating alignment of two or more magnetic sensors in a virtual reality (VR) or augmented reality (AR) display device, the method comprising:
   generating a first calibration waveform;
   energizing, with the first calibration waveform, a first conductive loop oriented in a first plane orthogonal to a first axis passing through the first conductive loop and a second conductive loop oriented in a second plane parallel to the first plane and spaced apart from the first conductive loop along the first axis;
   determining a first measurement, using a first type of magnetic sensor of the display device, indicative of an orientation of a magnetic field produced by the first and second conductive loops when energized with the first calibration waveform;
   generating a second calibration waveform;

energizing the first and second conductive loops with the second calibration waveform;

determining a second measurement, using a second type of magnetic sensor of the display device, indicative of an orientation of a magnetic field produced by the first and second conductive loops when energized with the second calibration waveform; and comparing the first measurement with the second measurement.

20. The method of claim 19, further comprising determining a calibration value based on the comparison of the first and second measurements.

21. The method of claim 20, further comprising storing the calibration value in a memory of the display device.

22. The method of claim 21, further comprising modifying readings from the first or second magnetic sensor based on the calibration value while executing an application using the display device.

23. A method for calibrating alignment of one or more magnetic sensors and one or more optical sensors in a virtual reality (VR) or augmented reality (AR) display device, the method comprising:

generating a calibration waveform;

energizing, with the calibration waveform, a first conductive loop oriented in a first plane orthogonal to a first axis passing through the first conductive loop and a second conductive loop oriented in a second plane parallel to the first plane and spaced apart from the first conductive loop along the first axis;

determining a first measurement, using a magnetic sensor of the display device, indicative of an orientation of a magnetic field produced by the first and second conductive loops when energized with the calibration waveform;

determining, with an optical sensor of the display device, a second measurement indicative of a spatial relationship of an optical fiducial marker with respect to the first conductive loop and the second conductive loop; and comparing the first measurement with the second measurement.

24. The method of claim 23, wherein determining the measurement indicative of the spatial relationship of the optical fiducial marker comprises determining the position or orientation of the optical fiducial marker.

25. The method of claim 23, further comprising determining a value indicative of an alignment direction of the optical sensor based on the measurement indicative of the spatial relationship of the optical fiducial marker.

26. The method of claim 23, further comprising determining a calibration value based on the comparison of the first and second measurements.

27. The method of claim 26, further comprising storing the calibration value in a memory of the display device.

28. The method of claim 27, further comprising modifying readings from the magnetic sensor or the optical sensor based on the calibration value while executing an application using the display device.

* * * * *